United States Patent
Gassner

(10) Patent No.: US 7,171,334 B2
(45) Date of Patent: Jan. 30, 2007

(54) METHOD AND APPARATUS FOR SYNCHRONIZING DATA ACQUISITION OF A MONITORED IC FABRICATION PROCESS

(75) Inventor: Michael J. Gassner, San Jose, CA (US)

(73) Assignee: Brion Technologies, Inc., Santa Clara, CA (US)

( * ) Notice: Subject to any disclaimer, the term of this patent is extended or adjusted under 35 U.S.C. 154(b) by 309 days.

(21) Appl. No.: 10/858,330

(22) Filed: Jun. 1, 2004

(65) Prior Publication Data
US 2005/0288893 A1    Dec. 29, 2005

(51) Int. Cl.
G06F 19/00    (2006.01)

(52) U.S. Cl. .................. 702/182; 702/117; 438/18; 156/345.13

(58) Field of Classification Search ........... 702/182, 702/127, 117, 116, 132, 136, 184–185; 700/108, 700/121; 438/16, 18, 24, 5, 10; 156/345.13
See application file for complete search history.

(56) References Cited

U.S. PATENT DOCUMENTS

| | | | |
|---|---|---|---|
| 5,444,637 A | 8/1995 | Smesny et al. | |
| 5,907,820 A | 5/1999 | Pan | |
| 5,967,661 A | 10/1999 | Renken et al. | |
| 6,033,922 A | 3/2000 | Rowland et al. | |
| 6,051,443 A | 4/2000 | Ghio et al. | |
| 6,160,621 A | 12/2000 | Perry et al. | |
| 6,244,121 B1 | 6/2001 | Hunter | |
| 6,542,835 B2 | 4/2003 | Mundt | |
| 6,630,995 B1 | 10/2003 | Hunter | |
| 6,671,660 B2 | 12/2003 | Freed | |
| 6,691,068 B1 | 2/2004 | Freed et al. | |
| 6,693,708 B1 | 2/2004 | Hunter | |
| 6,707,545 B1 | 3/2004 | Hunter | |
| 6,721,045 B1 | 4/2004 | Hunter | |
| 2002/0161557 A1 | 10/2002 | Freed | |
| 2003/0226951 A1 | 12/2003 | Ye et al. | |
| 2004/0098216 A1 | 5/2004 | Ye et al. | |

FOREIGN PATENT DOCUMENTS

| | | |
|---|---|---|
| WO | WO 02/17030 | 2/2002 |
| WO | WO 02/29495 | 4/2002 |

OTHER PUBLICATIONS

Kodak KAI-1100M Kodak KAI-11000CM Image Sensor, Device Performance Specification, Revision 3.0, Jun. 2, 2003, 42 pages.

*Primary Examiner*—John Barlow
*Assistant Examiner*—Hien Vo
(74) *Attorney, Agent, or Firm*—White & Case, LLP

(57) ABSTRACT

There are many inventions described and illustrated herein. In one aspect, the present invention is directed to a technique of, and system for autonomously monitoring fabrication equipment, for example, integrated circuit fabrication equipment. In one embodiment of this aspect of the invention, the present invention is an autonomous monitoring device including one or more event sensors (for example, acceleration, motion, velocity and/or inertial sensing device(s)) to detect a predetermined event of or by the fabrication equipment (for example, an event that is indicative of the onset, commencement, initiation and/or launch of fabrication process or sub-processes of or by the fabrication equipment). In response thereto, one or more process parameter sensors sample, sense, detect, characterize, analyze and/or inspect one or more parameters of the process in real time (i.e., during the fabrication process).

26 Claims, 23 Drawing Sheets

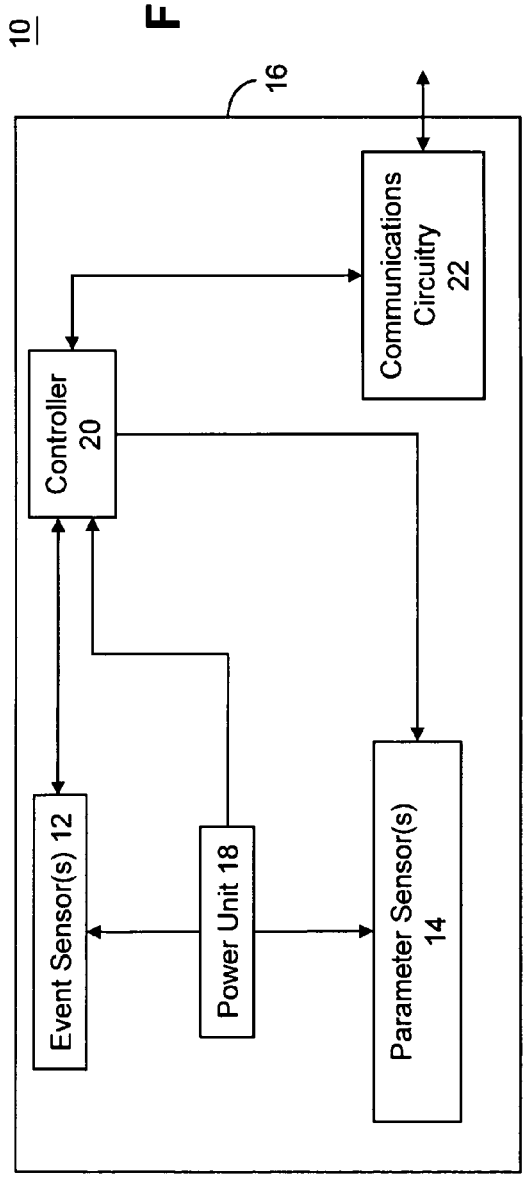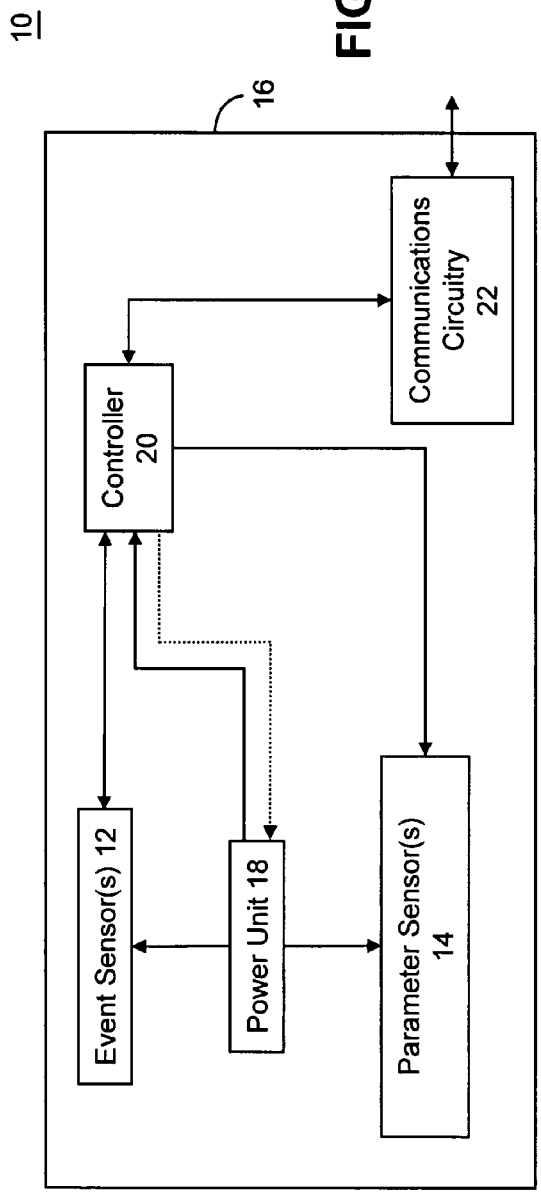

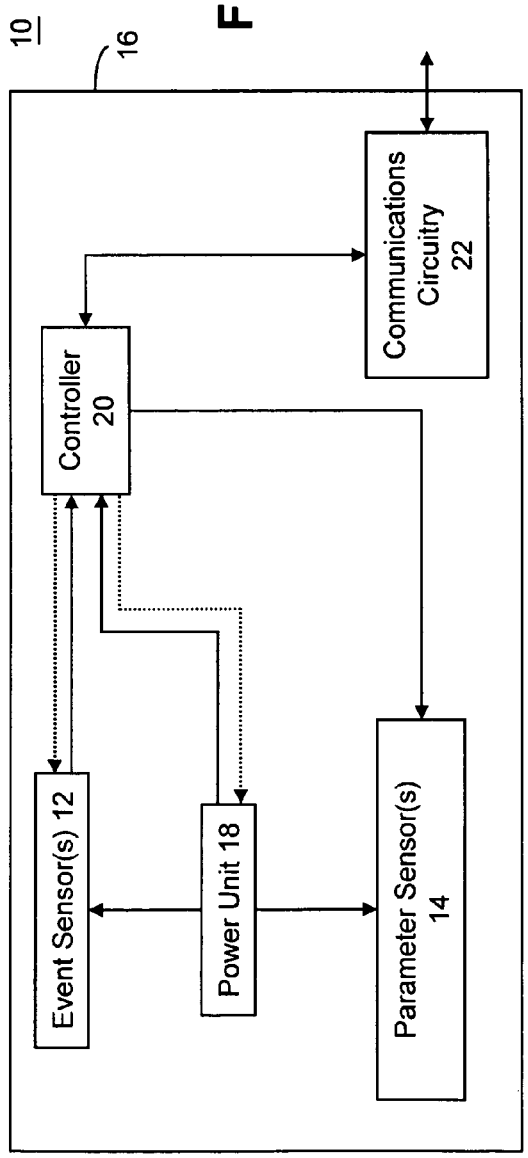
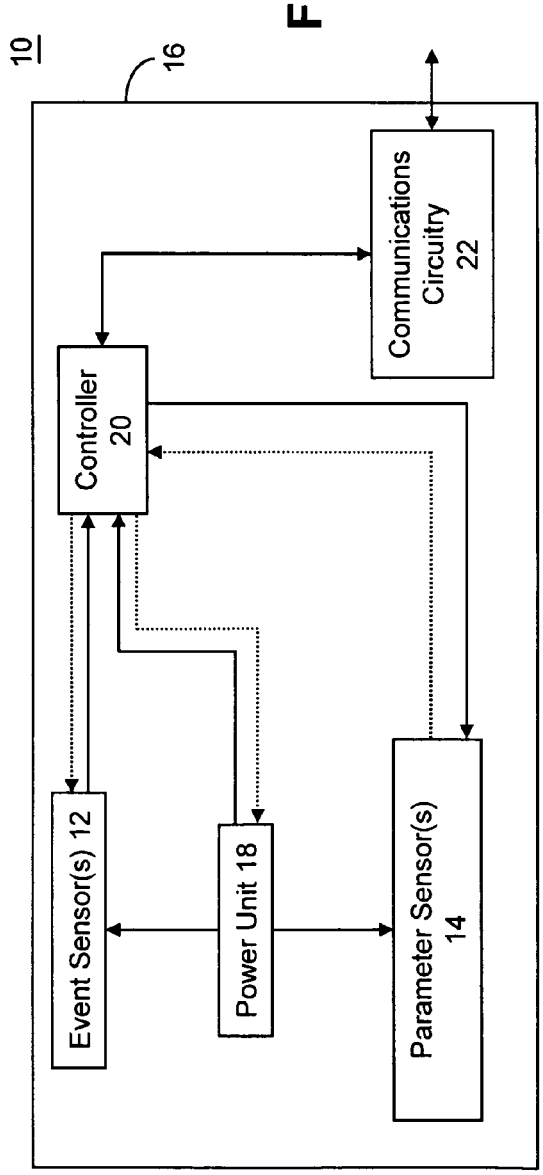

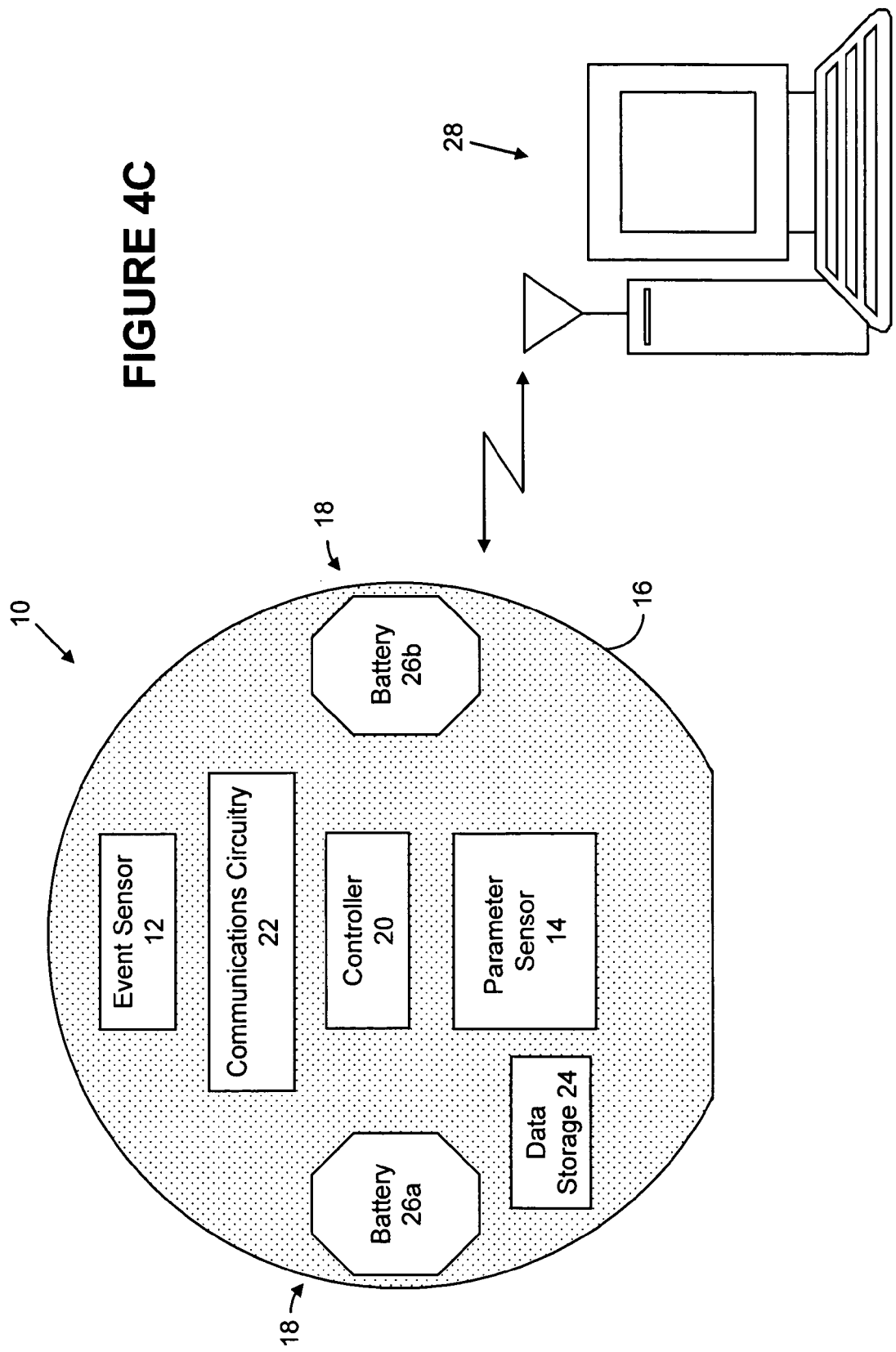

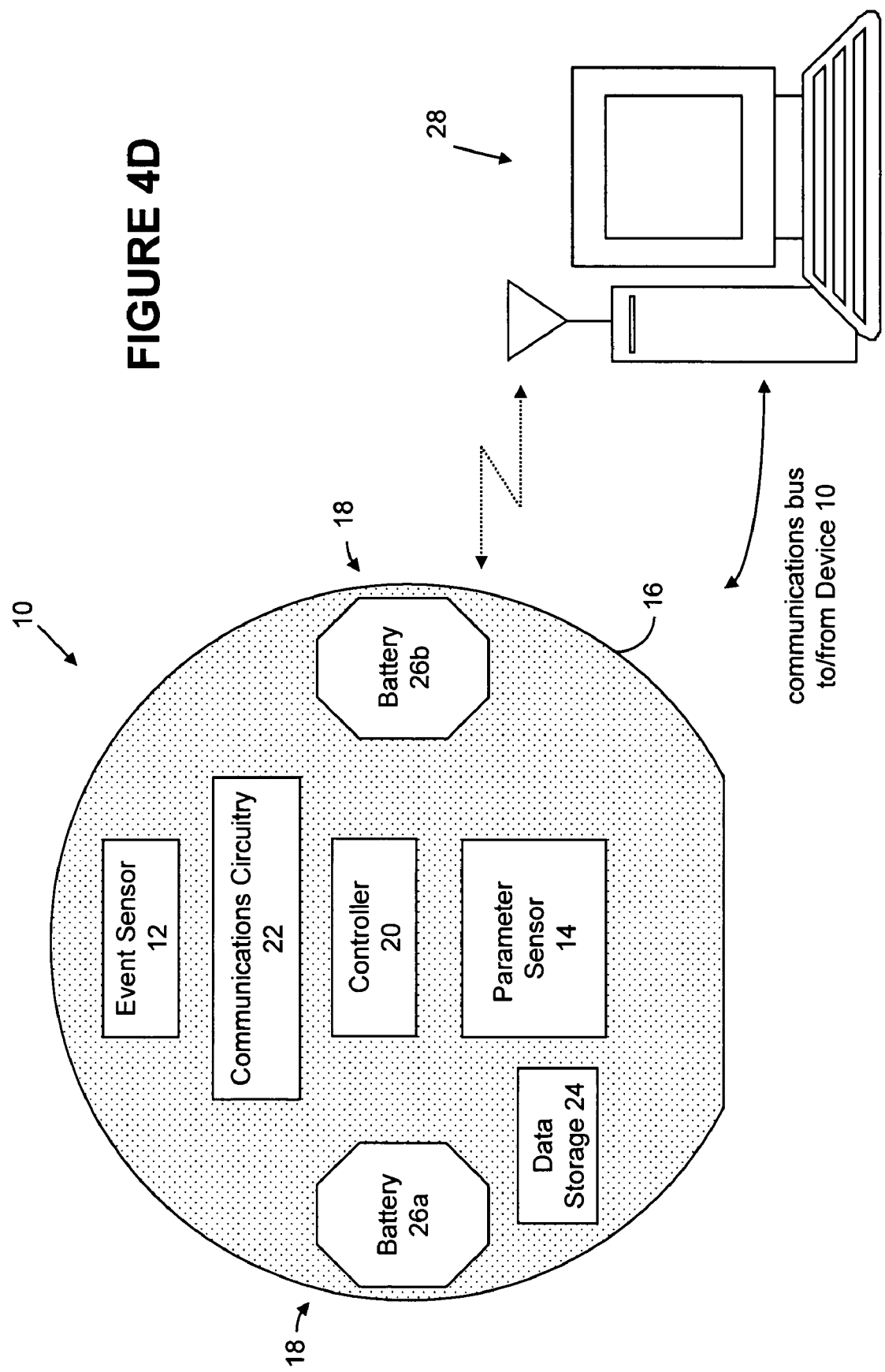

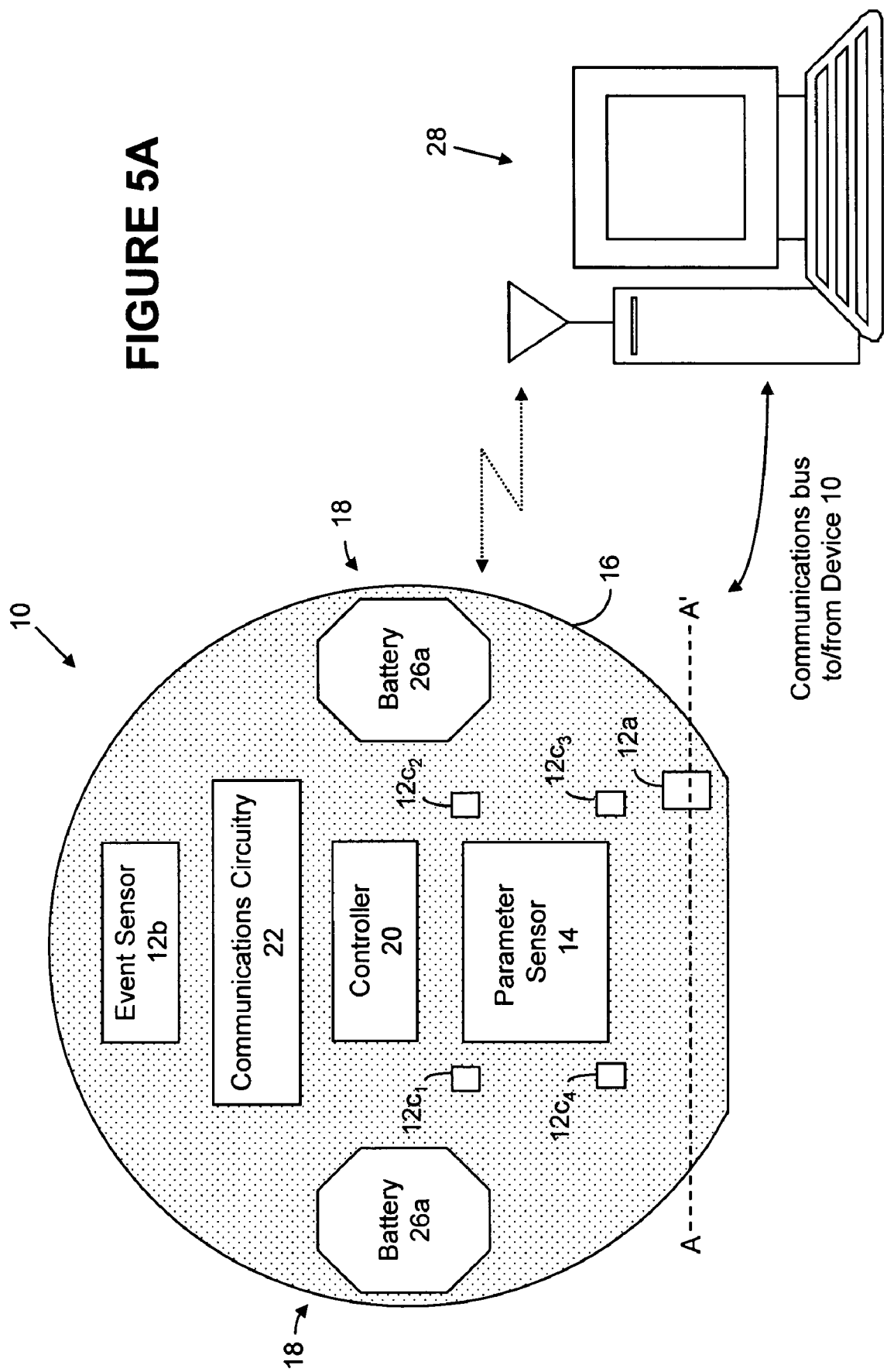

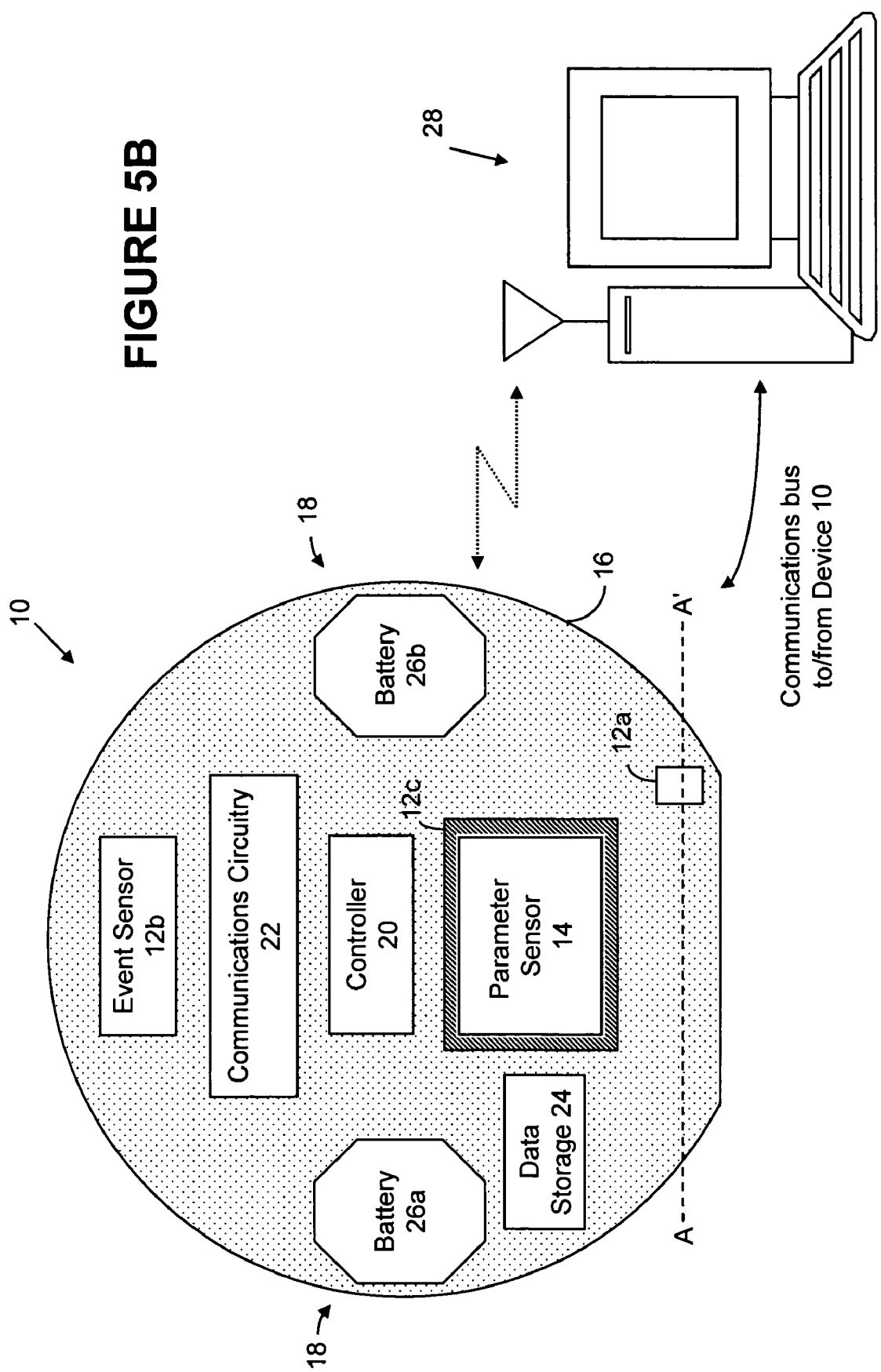

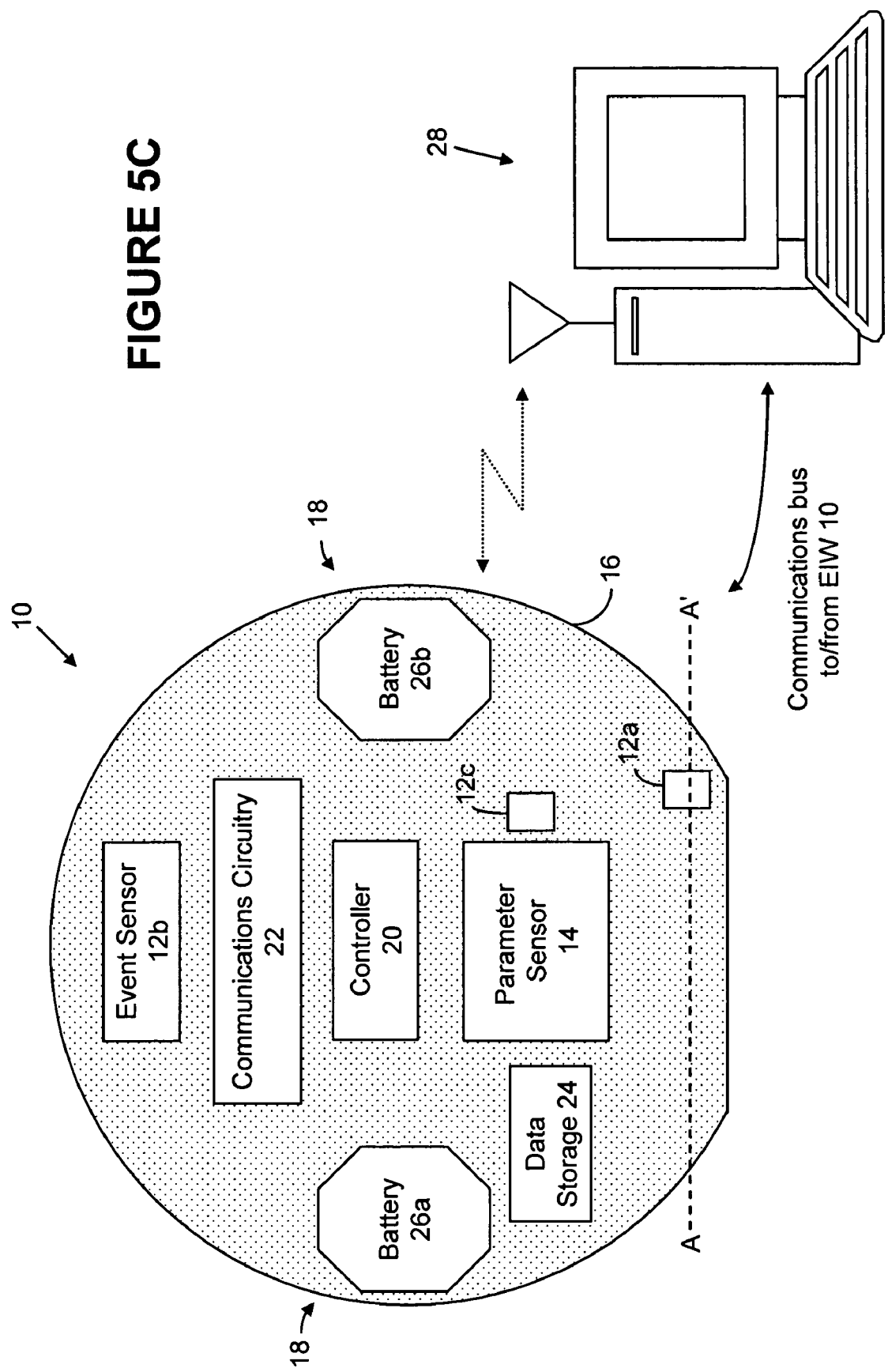

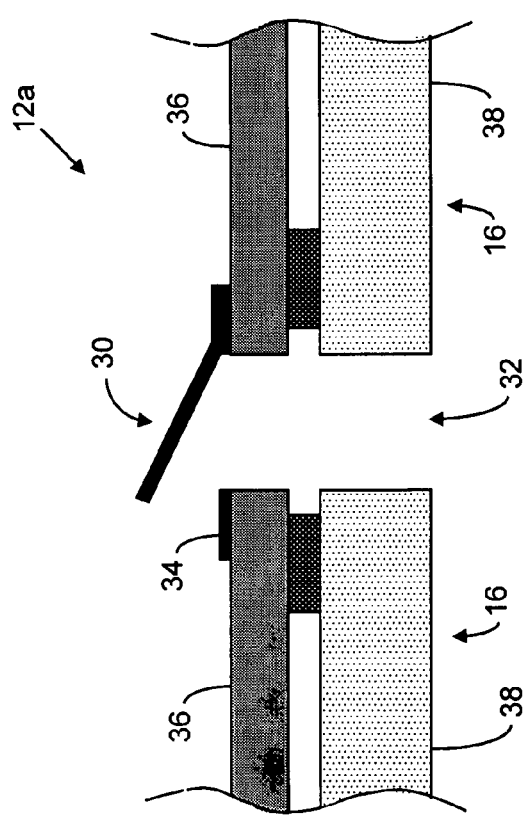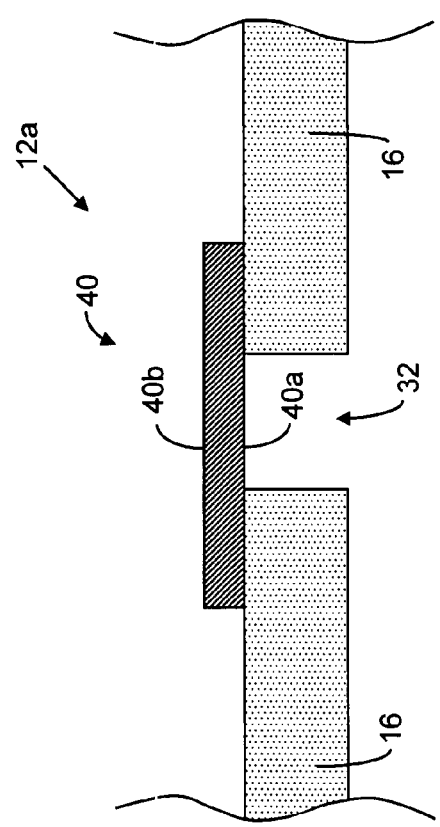

METHOD AND APPARATUS FOR SYNCHRONIZING DATA ACQUISITION OF A MONITORED IC FABRICATION PROCESS

BACKGROUND OF THE INVENTION

This invention relates to systems and techniques for monitoring fabrication processes of devices, for example, integrated circuit devices; and more particularly, in one aspect, to a system and technique that autonomously coordinates, synchronizes and/or correlates monitoring the operation of an integrated circuit fabrication process (or portion thereof) with respect to, or in connection with the data acquisition of one or more monitored parameters of the process.

Briefly, integrated circuits are typically fabricated on or in a semiconductor substrate that is commonly known as a wafer. A wafer is a substantially round, thin disk, currently having diameters such as four inches to twelve inches, and thicknesses in the range of two to three quarters of a millimeter.

During the fabrication processes, materials and/or layers are added, removed, treated and/or patterned on or in the wafer to form integrated circuits. In this regard, integrated circuit fabrication generally consists of a series of process stages, for example, photolithography, etch, strip, diffusion, ion implantation, deposition, and chemical mechanical planarization. At each step or stage, inspection(s) and measurement(s) is/are often conducted to monitor the fabrication equipment and materials, the individual processes, and interaction and integration among individual processes.

Monitoring-type equipment measure, evaluate and/or analyze selected/certain parameters on a processed production or test wafer in order to, among other things, measure, evaluate and/or analyze the integrity of the process(es). For example, certain conventional monitoring-type equipment may perform defect inspection, surface profiling, optical or other types of microscopy. Such monitoring often employs scanning electron microscopy ("SEM") in measuring, evaluating and/or analyzing the integrity of the process(es). An SEM may require the wafer (production or test wafer) to be cross-sectioned in order to analyze its profile.

Another monitoring-type equipment is one that is disposed in the fabrication equipment in order to measure, for example, in real time, a parameter of the fabrication process. (See, for example, U.S. Pat. No. 4,585,342). During data collection or thereafter, the measured parameter may be analyzed. At the completion of processing, the real-time monitoring-type equipment may be removed from the fabrication equipment.

The real-time monitoring-type equipment employs real-time sensing circuitry that is often autonomous with respect to the fabrication equipment. In this regard, real-time monitoring-type equipment is typically untethered (i.e., not in communication with the fabrication equipment, and the control thereof). As such, the real-time sensing circuitry may have difficulty coordinating the measurement and recording of certain or selected events or processes performed by the fabrication equipment.

In addition, autonomous real-time monitoring-type equipment is often battery powered. That is, the real-time sensing circuitry, as well as collateral circuitry (memory storage and communication), are provided electrical power via rechargeable batteries. As such, limiting some or a significant amount of power consumption to correlate with the measurement and recording of certain or selected events or processes performed by the fabrication equipment will enhance the efficiency of power consumption. The consideration of power consumption is exacerbated where, for example, the real-time monitoring-type equipment that implements rechargeable batteries is only periodically or intermittently employed, where the fabrication equipment undergoes an extensive calibration routine prior to performing the fabrication process, or where heat generated by monitoring-type equipment could detrimentally effect or influence the process being monitored.

SUMMARY OF THE INVENTION

There are many inventions described and illustrated herein. In a first principal aspect, the present invention is a device and technique for monitoring a process parameter of a process to manufacture an integrated circuit using integrated circuit processing equipment. In one embodiment of this aspect of the invention, the device includes a substrate having a wafer or wafer-like shape, which is capable of being disposed within the integrated circuit processing equipment, and an event sensor (for example, an acceleration, velocity, inertial or position sensor), disposed on or in the substrate, to generate output data which is representative of events in or of the integrated circuit processing equipment. A controller, coupled to the event sensor, receives the output data and detects a predetermined event or sequence of predetermined events based thereon (by, for example, analyzing the output data of the event sensor using a plurality of predetermined criteria). The controller generates a control signal in response to detecting the predetermined event or predetermined sequence of events. The device also includes a process parameter sensor, coupled to the controller and disposed on or in the substrate, to sample a process parameter of the process to manufacture an integrated circuit in response to the control signal.

In one embodiment, the substrate is capable of being disposed on a wafer stage of the integrated circuit processing equipment. In another embodiment, where the integrated circuit processing equipment is lithographic equipment, the process parameter sensor may be an image sensor which samples the intensity of an aerial image of a photomask produced by the integrated circuit processing equipment. In this embodiment, the event sensor may be an accelerometer and the output data is representative of the acceleration of the wafer stage of the integrated circuit processing equipment. The event sensor may also be, for example, a velocity, inertial or position sensor.

Moreover, the device may include communications circuitry, coupled to the controller, to provide the data which is representative of the sampled process parameter to external circuitry. The device may also include at least one rechargeable battery, to provide electrical power to the controller and the process parameter sensor.

In another principal aspect, the present invention is a device for monitoring a process parameter of a process to manufacture an integrated circuit using integrated circuit processing equipment. The device of this aspect of the invention includes a substrate that is capable of being disposed on a wafer stage of the integrated circuit processing equipment and a first event sensor, disposed on or in the substrate, to generate first output data which is representative of first events in or of the integrated circuit processing equipment. The device may also include a second event sensor, disposed on or in the substrate, to generate second output data which is representative of second events in or of the integrated circuit processing equipment, wherein the first and second events are different types of events. Further, the device of this aspect includes a controller, coupled to the first and second event sensors, to receive the second output data and to detect a predetermined event or sequence of predetermined events based thereon, wherein the controller generates a control signal in response to detecting the predetermined event or predetermined sequence of events. A process parameter sensor, coupled to the controller and disposed on or in the substrate, samples a process parameter of the process to manufacture an integrated circuit in response to the control signal.

In one embodiment, the first output data is representative of whether the substrate is disposed on the wafer stage of the integrated circuit processing equipment. In another embodiment, the second event sensor is a velocity, inertial, acceleration or position sensor. Further, the process parameter sensor samples temperature, pressure, chemical concentration, fluid flow rate, illumination intensity, image projection, focus, photomask integrity, aerial image integrity or surface profile.

Where the integrated circuit processing equipment is lithographic equipment, the process parameter sensor may be an image sensor which samples the intensity of an aerial image of a photomask produced by the integrated circuit processing equipment. Further, the second event sensor is an accelerometer and the output data is representative of the acceleration of the wafer stage of the integrated circuit processing equipment. The second event sensor may also be a velocity, inertial or position sensor.

In another embodiment, the first output data is representative of whether the substrate is disposed on the wafer stage of the integrated circuit processing equipment and the controller, in response to the first output data, generates an enable signal and provides the enable signal to the process parameter sensor. The enable signal enables the process parameter sensor to sample a process parameter of the process to manufacture an integrated circuit in response to the control signal.

The controller, in one embodiment, detects the predetermined event or sequence of predetermined events by, for example, analyzing the second output data using a plurality of predetermined criteria. The controller may include data storage for storing the plurality of predetermined criteria.

Moreover, the device of this aspect of the invention may include communications circuitry, coupled to the controller, to provide the data which is representative of the sampled process parameter to external circuitry. The device may also include at least one rechargeable battery, to provide electrical power to the controller and the process parameter sensor.

In yet another principal aspect, the present invention is a device for monitoring a process parameter of a process to manufacture an integrated circuit using integrated circuit processing equipment. The device of this aspect of the invention comprises a substrate that is capable of being disposed on a wafer stage of the integrated circuit processing equipment and an event sensor, disposed on or in the substrate, to generate output data which is representative of acceleration, velocity, inertia or motion of the substrate. The device also includes a controller, coupled to the event sensor, to receive the output data and to detect a predetermined event or sequence of predetermined events based thereon. The controller generates a data acquisition signal in response to detecting the predetermined event or predetermined sequence of events. A process parameter sensor, coupled to the controller and disposed on or in the substrate, samples a process parameter of the process to manufacture an integrated circuit in response to the data acquisition signal.

In one embodiment, the integrated circuit processing equipment is lithographic equipment and the process parameter sensor is an image sensor which samples the intensity of an aerial image of a photomask produced by the integrated circuit processing equipment.

In another embodiment, the controller detects the predetermined event or sequence of predetermined events by analyzing the output data of the event sensor using a plurality of predetermined criteria. The controller may include data storage for storing the plurality of predetermined criteria.

Moreover, the device may include communications circuitry, coupled to the controller, to provide the data which is representative of the sampled process parameter to external circuitry. The device may also include at least one rechargeable battery, to provide electrical power to the controller and the process parameter sensor.

Again, there are many inventions described and illustrated herein. This Summary is not exhaustive of the scope of the present invention. Moreover, this Summary is not intended to be limiting of the invention and should not be interpreted in that manner. While certain embodiments, features, attributes and advantages of the inventions have been described in this Summary, it should be understood that many others, as well as different and/or similar embodiments, features, attributes and/or advantages of the present inventions, which are apparent from the description, illustrations and claims, which follow.

BRIEF DESCRIPTION OF THE DRAWINGS

In the course of the detailed description to follow, reference will be made to the attached drawings. These drawings show different aspects of the present invention and, where appropriate, reference numerals illustrating like structures, components, materials and/or elements in different figures are labeled similarly. It is understood that various combinations of the structures, components, materials and/or elements, other than those specifically shown, are contemplated and are within the scope of the present invention.

FIGS. 3A–3I are schematic block diagrams of an autonomous monitoring device, including a controller, according to several embodiments of the present invention(s);

FIGS. 4A–4D are schematic representations of an autonomous monitoring device, in conjunction with a substrate having a wafer shape, according to several embodiments of the present invention(s);

FIGS. 5A–5C are schematic representations of an autonomous monitoring device, in conjunction with additional event sensors, according to several embodiments of the present invention(s);

FIGS. 6A and 6B are cross-sectional views of two vacuum sensor embodiments, sectioned along lines A–A' of the autonomous monitoring device of FIGS. 5A–5C, according to an aspect of the present invention;

DETAILED DESCRIPTION

Figure 1A:
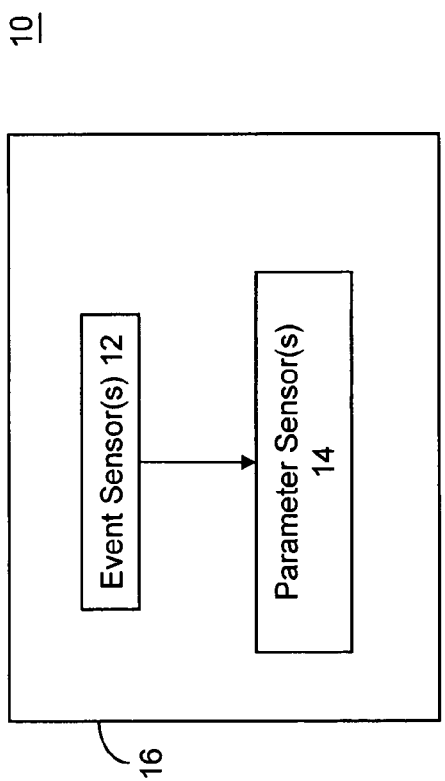
FIGS. 1A and 1B are schematic block diagrams of an autonomous monitoring device according to one embodiment of a first aspect of the present invention(s)

There are many inventions described and illustrated herein. In one aspect, the present invention is directed to a technique of, and system for autonomously monitoring fabrication equipment, for example, integrated circuit fabrication equipment. In one embodiment of this aspect of the invention, the present invention is an autonomous monitoring device including one or more event sensors (for example, acceleration, motion, velocity and/or inertial sensing device(s)) to detect a predetermined event (for example, an event that is indicative of the onset, commencement, initiation and/or launch of fabrication process by the fabrication equipment). In response thereto, one or more process parameter sensors sample, sense, detect, characterize, analyze and/or inspect one or more parameters of the process in real time (i.e., during the fabrication process).

In one embodiment, one or more event sensors detect, sense and/or measure predetermined events that are, for example, indicative of the onset, commencement, initiation and/or launch of fabrication process by detecting, sensing, sampling and/or measuring thermal, mechanical, chemical, magnetic, radiant and/or electrical parameters of or near the autonomous monitoring device, one or more components thereof, and/or the fabrication equipment. For example, the one or more event sensors may detect, sense, sample and/or measure temperature, illumination, motion, acceleration, velocity and/or position (relative or absolute) of the autonomous monitoring device, or one or more components thereof.

An event sensor may indirectly detect, sense, sample and/or measure one or more predetermined events (or sequence of predetermined events) of or by the fabrication equipment. For example, the event sensor may detect, sense and/or sample changes in acceleration and, as such, where the autonomous monitoring device is disposed on a wafer stage or chuck of integrated circuit fabrication equipment, the event sensor may detect, sense and/or sample the acceleration or deceleration of that wafer stage or chuck. Notably, data which is representative of the acceleration and/or deceleration of a wafer chuck of integrated circuit fabrication equipment (i.e., one or more predetermined events or sequence of events)) may indicate the onset, commencement, initiation and/or launch of one or more fabrication processes or sub-processes by the fabrication equipment.

In response to detecting or identifying one or more predetermined events or sequence of events, the event sensor may enable the one or more process parameter sensors to sample, sense, detect, characterize, analyze and/or inspect one or more parameters of the fabrication process in real time. The parameter sensors may measure, for example, one or more parameters (for example, temperature, pressure, chemical concentration, fluid flow rate, illumination intensity, image projection, focus, photomask integrity, and/or surface profile) pertaining to photolithography, etch, strip, diffusion, ion implantation, deposition, and chemical mechanical planarization steps or stages.

In another embodiment, the autonomous monitoring device includes a controller, coupled to the event sensor(s) to receive data which is representative of, for example, temperature, illumination, motion, acceleration, velocity and/or position (relative or absolute). The controller may process and/or analyze that data to identify one or more predetermined events (and/or one or more sequence of events) of or by the fabrication equipment. As mentioned above, the one or more predetermined events (and/or one or more sequence of events) may indicate the onset, commencement, initiation and/or launch of one or more fabrication processes or sub-processes by the fabrication equipment. Upon identifying the one or more predetermined events (and/or sequence of events), the controller enables, instructs and/or engages one or more process parameter sensors to sample, sense, detect, characterize, analyze and/or inspect one or more parameters of the fabrication process (es) in real time (for example, temperature, pressure, chemical concentration, fluid flow rate, illumination intensity, image projection, focus, photomask integrity, and/or surface profile).

The controller may manage, supervise and/or control other aspects of the sensors, as well as manage, supervise and/or control other circuitry, components, operations and/or functions of the autonomous monitoring device. For example, the controller may manage the power consumption of selected circuitry of the autonomous monitoring device based on or in response to identifying one or more predetermined events (and/or one or more sequence of events) of or by the fabrication equipment. In this regard, the controller may, prior to detecting and/or identifying one or more predetermined events (and/or one or more sequence of events), maintain one or more process parameter sensors in a predetermined power state (for example, a low power consumption state). Upon detecting and/or identifying one or more predetermined events (and/or one or more sequence of events), the controller may instruct one or more process parameter sensors to change its power state (for example, from a low power consumption state to a high power consumption state) and/or one or more event sensors to change its power state (for example, from a high power consumption state to a low power consumption state). In this way, the sensors, circuitry and components of the autonomous monitoring device are maintained and/or controlled in an enhanced, efficient and/or optimum manner.

The controller may also manage, supervise and/or control the operation of one or more event sensors. For example, in one embodiment where the autonomous monitoring device is employed in the integrated circuit fabrication equipment having, for example, a vacuum chuck, the controller may employ a vacuum detection signal from a vacuum sensor (i.e., a first event sensor) to detect the presence or absence of a vacuum on the back side of the autonomous monitoring device. In this regard, the presence of a vacuum, as detected by the vacuum sensor indicates the autonomous monitoring device is disposed on the wafer chuck. In response, the controller may change the operational state of one or more event sensors from, for example, an off state (a first power state) to a wait/diagnostic complete state or a fully operational or sensing state (a second power state). That is, the controller may change a second event sensor (a motion sensor, such as an accelerometer, inertial or velocity sensor) to a fully operational state in order to detect and/or measure one or more additional predetermined events (and/or one or more sequence of events).

Notably, in response to detecting or identifying one or more additional predetermined events (and/or one or more sequence of events) from data provided by the second event sensor (for example, the accelerometer, inertial or velocity sensor), the controller may change the operational state of one or more (or selected) process parameter sensors to a data acquisition or collection state (i.e., a high power consumption state). In this way, the one or more (or selected) process parameter sensors acquire, record, sense, sample and/or collect information, for example, under the control of the controller. In this embodiment, the overall power consumption of the autonomous monitoring device is more efficiently managed.

The one or more event sensors and one or more parameter sensors of the autonomous monitoring device of the present invention are located, secured and/or fixed on or in a substrate or platform. In one embodiment, the substrate may have a shape that is the same or substantially the same as a production-type wafer. In this way, the substrate may be disposed within integrated circuit fabrication equipment with little or no modification to the equipment and/or thereby experience the same or substantially the same environment/process as a production-type wafer (i.e., a wafer having actual integrated circuits fabricated thereon).

Notably, in certain embodiments, as mentioned above, the sensors, circuitry and components of the autonomous monitoring device, for example, a power source, a controller (for example, microprocessor, state machine and/or field programmable gate array ("FPGA")), data storage (for example, random access memory ("RAM") and/or read only memory ("ROM")) and communications circuitry, may protrude from the surface of the substrate, thereby creating a portion that includes a non-flat surface topography, which is different from a typical production-type wafer. Thus, in certain embodiments, the autonomous monitoring device of the present invention includes a substrate that has a similar form factor and/or profile as a production-type wafer, may be handled (automatically or manually) like a production-type wafer, and/or may be employed or disposed in the appropriate processing equipment with little or no change to the typical configuration of the equipment.

It may be advantageous to package and/or configure such circuitry and components in or on the wafer or wafer-like substrate such that the autonomous monitoring device may be handled as a typical production-type wafer (for example, automatically) within the equipment. In this way, the processing equipment may interpret the autonomous monitoring device as a production-type wafer and handle the device as a typical production-type wafer; thereby eliminating additional impact on the "uptime" of the processing equipment.

For example, where autonomous monitoring device includes circuitry and sensors to monitor a CVD process, the autonomous monitoring device may have the same or substantially the same planar size and shape as a production-type wafer, but may be (slightly) thicker. As such, the autonomous monitoring device "behaves" like a thick wafer and the deposition equipment may handle the autonomous monitoring device with little or no modification to the equipment. Alternatively, for example, where the autonomous monitoring device include one or more image sensors integrated on or in the substrate, the autonomous monitoring device may be placed (manually or automatically) into a lithography equipment (for example, an optical stepper or scanner) to directly sense, sample and/or measure the light intensity and image patterns of the aerial image that is projected on the surface of a production-type wafer.

Figure 1B:
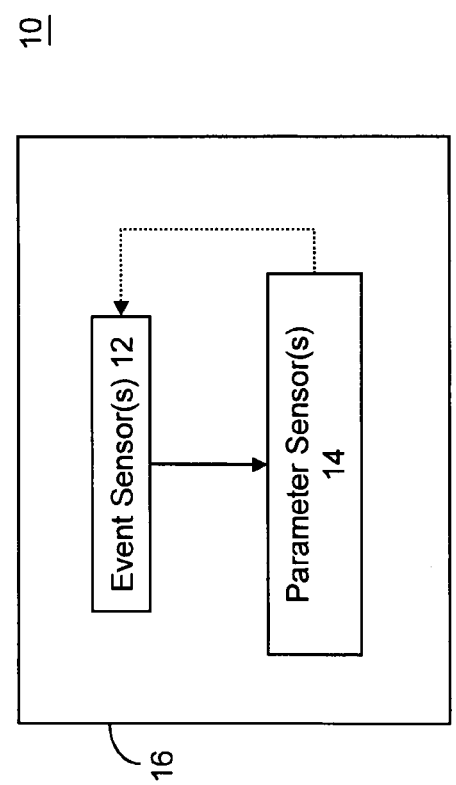

With reference to FIGS. 1A and 1B, in one embodiment of the present invention, autonomous monitoring device 10 includes one or more event sensors 12 and one or more parameter sensors 14. The event sensor(s) 12 and parameter sensor(s) 14 are both disposed on or in platform or substrate 16. In this embodiment, event sensor(s) 12, upon detection of a predetermined event, (for example, an event that is indicative of the onset, commencement, initiation and/or launch of fabrication process), engage, instruct and/or enable parameter sensor(s) 14 to sample, sense, detect, characterize, analyze and/or inspect one or more process parameters, in real time (i.e., during the fabrication process).

The autonomous monitoring device 10 of the present invention may employ any sensor to sample, sense, detect, and/or measure a predetermined event and/or parameter of a fabrication process. All known types of sensors are intended to fall within the scope of the present invention provided such sensors may be implemented into or onto autonomous monitoring device 10. For example, autonomous monitoring device 10 may employ one or more sensors described and illustrated in U.S. patent application Ser. No. 10/677,563, entitled "Method and Apparatus for Monitoring Integrated Circuit Fabrication" (hereinafter "the '563 application"), now U.S. Pat. No. 6,807,503. In this regard, event sensor(s) 12 and/or parameter sensor(s) 14 may be a sensor described and illustrated in the '563 application. For example, autonomous monitoring device 10 may employ an accelerometer as event sensor 12 to detect acceleration and/or deceleration of platform or substrate 16 when disposed on a wafer chuck.

All of the inventions/embodiments (including, for example, the optical, chemical, physical, temperature, MEMS sensors and sensing techniques) described and illustrated in the '563 application may be implemented in conjunction with the inventions described and illustrated herein. For the sake of brevity, the inventions/embodiments described and illustrated in the '563 application, implemented in conjunction with the inventions described and illustrated herein, will not be repeated in detail. It is expressly noted, however, that the entire contents of the '563 application including, for example, the features, attributes, alternatives, materials, techniques and advantages of all of the inventions, are incorporated by reference herein.

Moreover, autonomous monitoring device 10 of the present invention may employ one or more image sensors described and illustrated in U.S. patent application Ser. No. 10/390,806, entitled "System and Method for Lithography and Mask Inspection" (hereinafter "the '806 application"), now U.S. Pat. No. 6,828,542, as parameter sensor(s) 14. In this regard, the image sensors of the '806 application may be employed to sample, measure, collect and/or detect, in situ, an aerial image (a parameter) produced or generated by the interaction between a photomask (for example, a photomask that is used in the production of integrated circuits on product wafers) and lithographic equipment. In this way, the aerial image used, generated or produced to measure, inspect, characterize and/or evaluate a particular photomask is the same aerial image used, generated or produced during wafer exposure in integrated circuit manufacturing.

Notably, all of the inventions/embodiments (including, for example, the image sensors, platform attributes, communications circuitry, data collection and processing techniques, and system applications) described and illustrated in the '806 application may be implemented in conjunction with the inventions described and illustrated herein. For the sake of brevity, the inventions/embodiments described and illustrated in the '806 application, implemented in conjunction with the inventions described and illustrated herein, will not be repeated in detail. It is expressly noted, however, that the entire contents of the '806 application including, for example, the features, attributes, alternatives, materials, techniques and advantages of all of the inventions, are incorporated by reference herein.

With reference to FIG. 1B, in one embodiment, one or more parameter sensors 14 may provide a feedback signal to one or more event sensors 12 after receipt of the instruction and/or engagement signal from one or more event sensors 12. In this way, one or more event sensors 12 may, in response to such a feedback signal, continue with or change its detection routine (for example, be prepared to detect an additional or further predetermined event (which may or may not be connected with the initial predetermined event) and/or change its power state (for example, switch to a low or off power state). Moreover, the feedback signal may also be an indication to event sensor(s) 12 that one or more parameter sensor(s) 14 have completed (or will complete) the real-time sampling, sensing, detecting, characterizing, analyzing and/or inspecting one or more process parameters. In response, event sensor(s) 12 may be enabled or prepared to detect an additional or second predetermined event (for example, an event that indicates the onset, commencement, initiation and/or launch of a second stage of the fabrication process by the fabrication equipment). The event sensor(s) 12 may, in response to detecting the second event, engage, instruct and/or enable parameter sensor(s) 14 to sample, sense, detect, characterize, analyze and/or inspect one or more process parameters, in real time, of the second stage of the fabrication process.

Figure 2A:
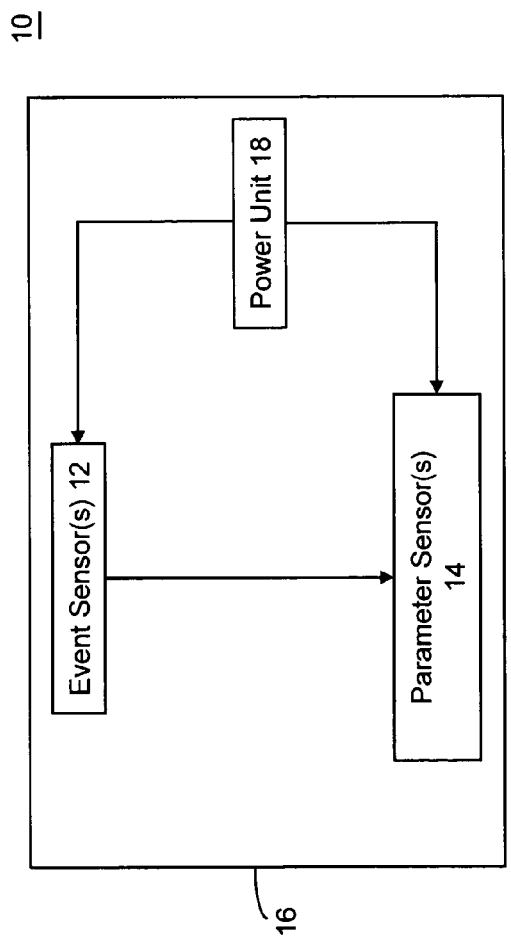
FIGS. 2A and 2B are schematic block diagrams of an autonomous monitoring device according to other embodiments of the present invention(s)
Figure 2B:
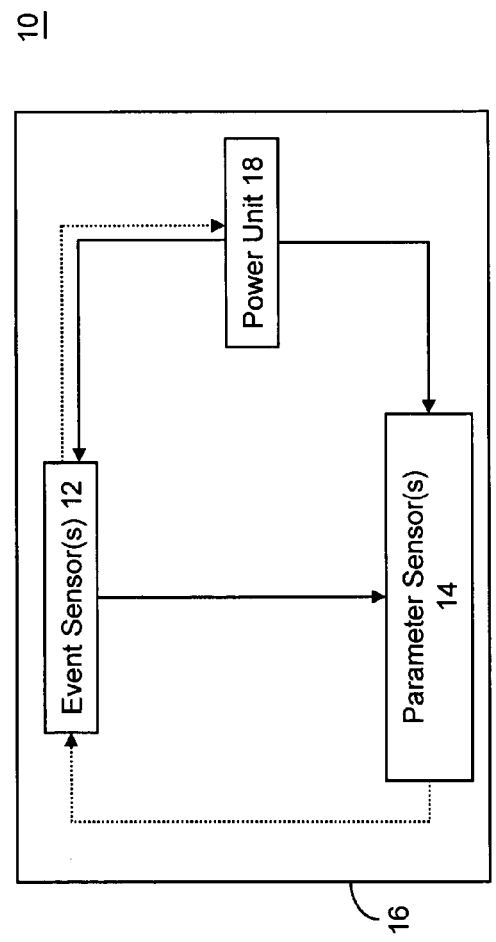
Figure 3A:
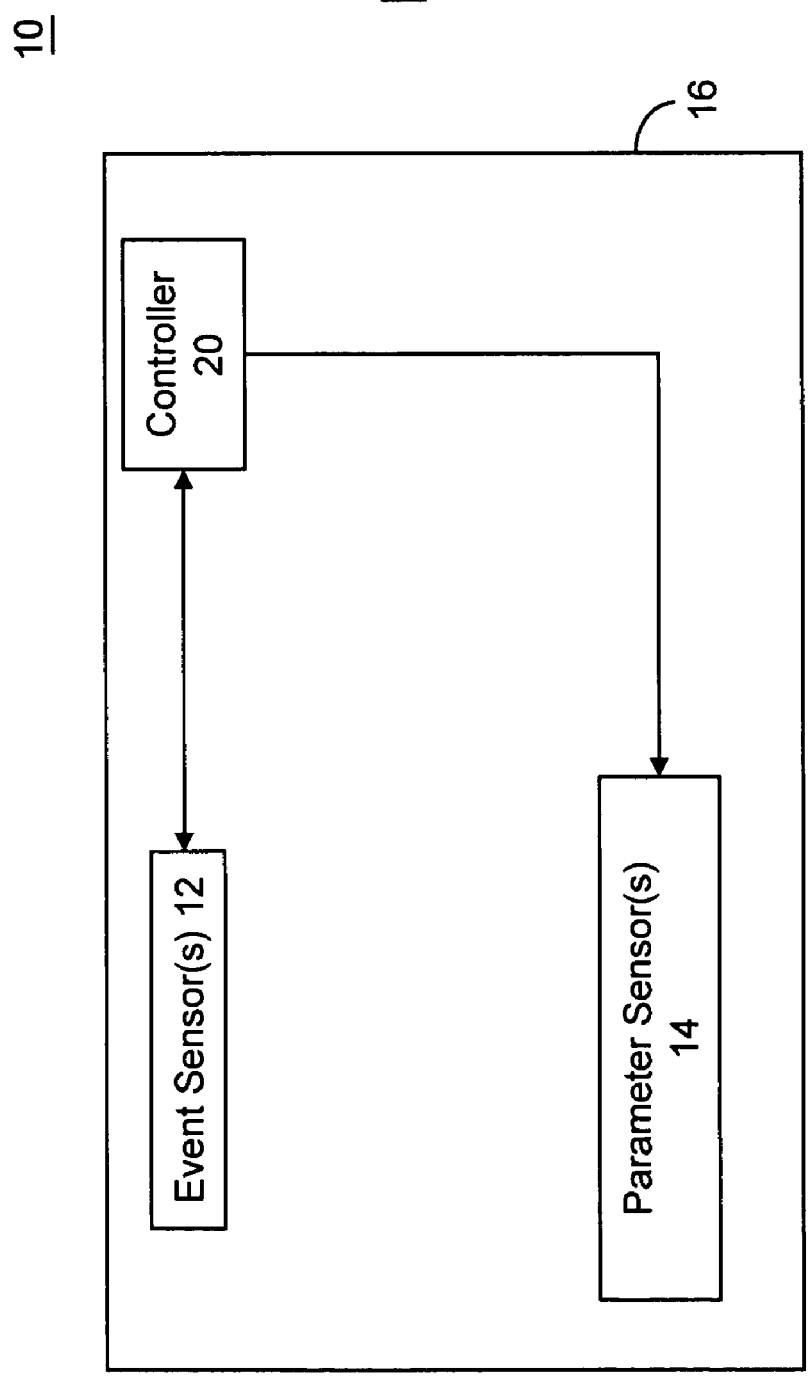
Figure 3B:
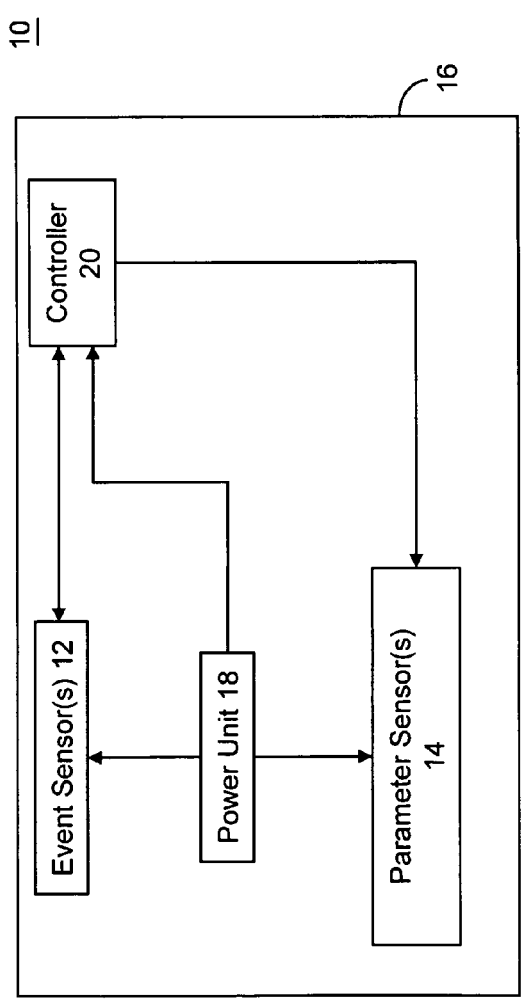
Figure 3C:
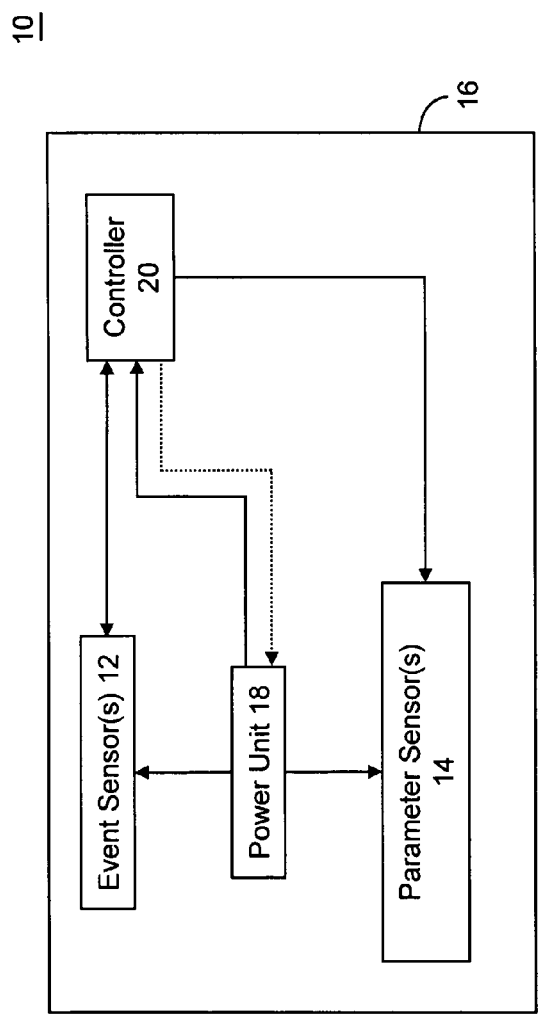
Figure 3D:
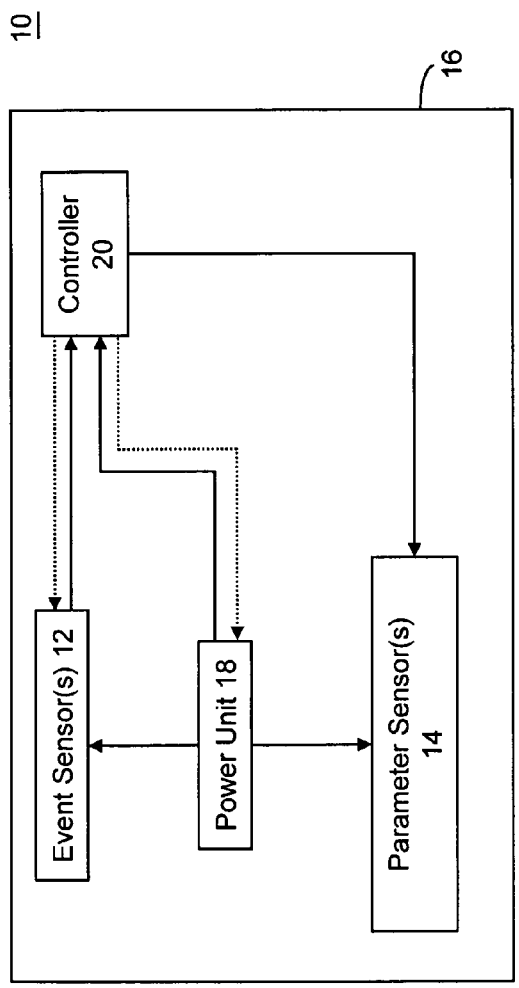
Figure 3E:
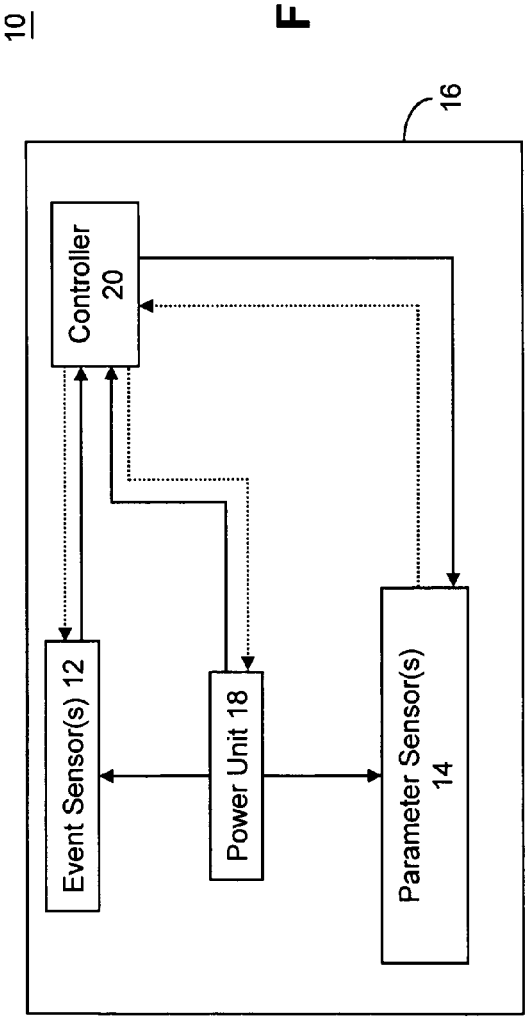
Figure 4A:
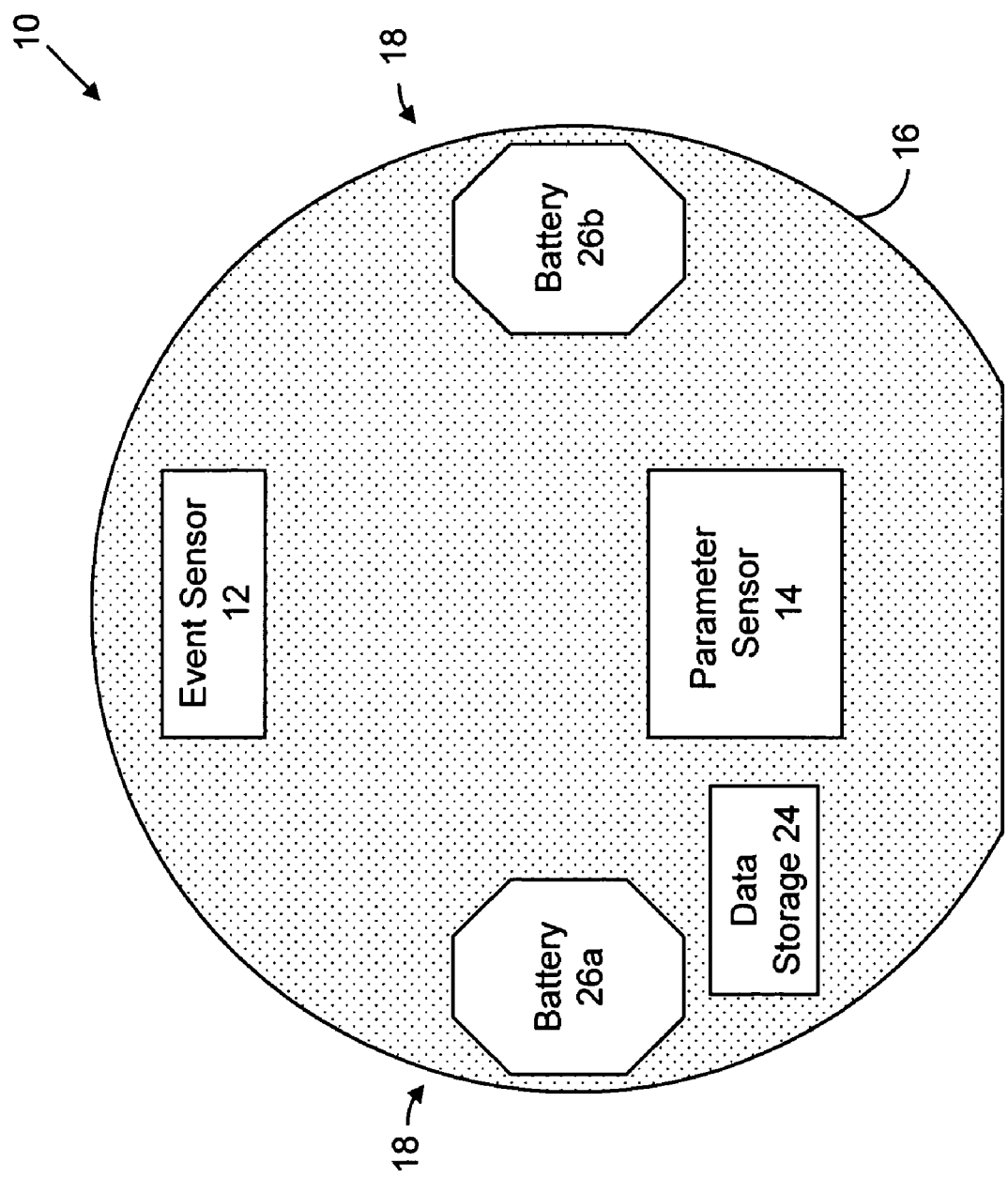
Figure 4B:
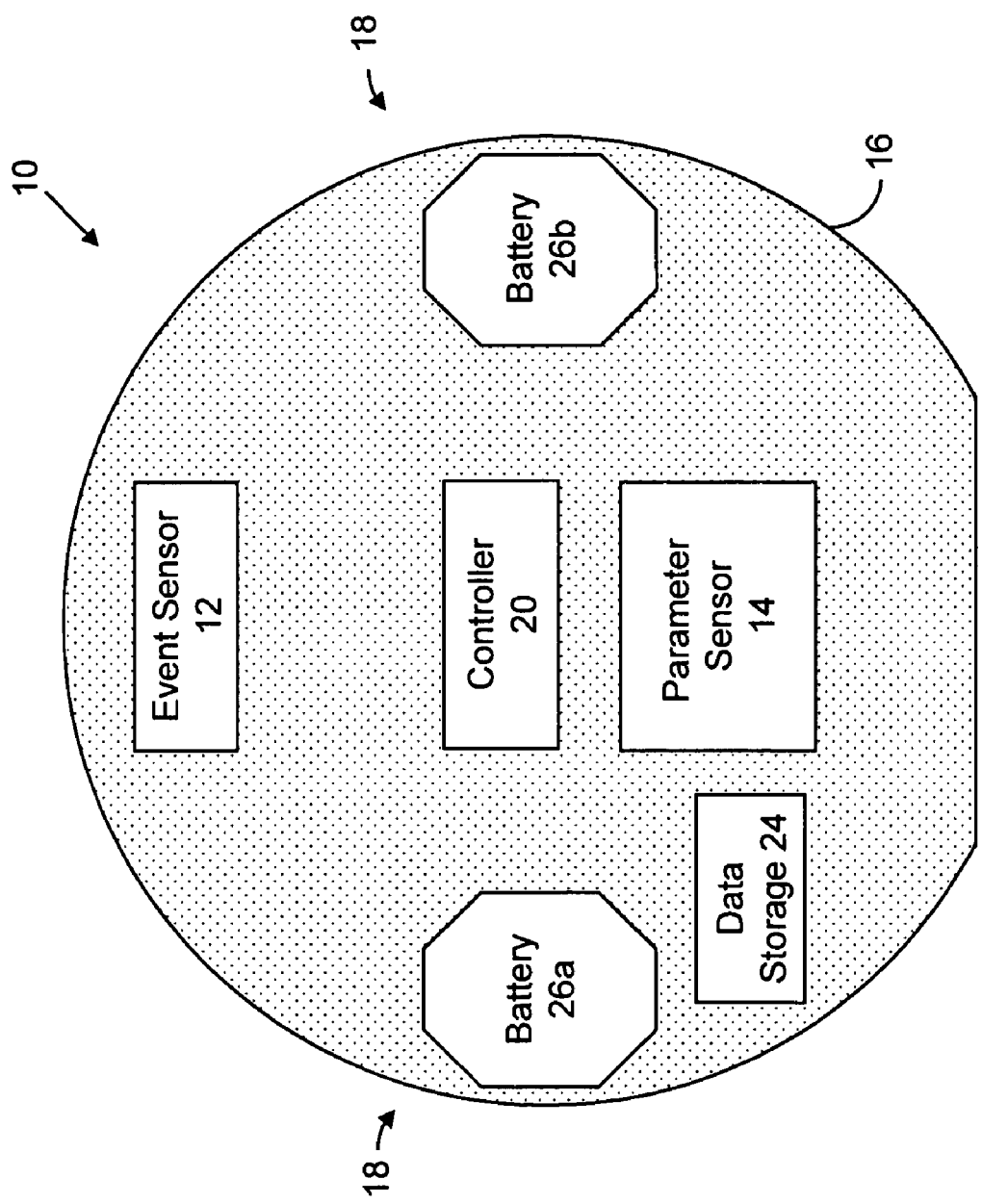

With reference to FIGS. 2A and 2B, in another embodiment, autonomous monitoring device 10 may also include power unit 18 to provide electrical power to one or more event sensors 12 and/or one or more parameter sensors 14. The autonomous monitoring device 10, in this embodiment, receives power from a built-in or integrated power unit 18, for example, one or more batteries, that is resident on platform or substrate 16. The power unit 18 may be a primary source of electrical power and thereby may provide all or substantially all of the power requirements of autonomous monitoring device 10. The power unit 18 may be rechargeable (after process parameter data capture routines), for example, one or more lithium-ion based batteries and/or one or more polymer based batteries. Where the invention is employed in a clean room environment, for example, it may be advantageous to employ a power unit 18 that is stable and durable to prevent leakage and contamination.

Notably, electrical power may also be provided either via wired or wireless techniques to autonomous monitoring device 10. For example, electrical power may be obtained directly or indirectly from the fabrication equipment (not illustrated). In this way, some or all of the electronics may be powered by an external power source, which may facilitate use of higher power consumption components that may offer features not offered by lower power consumption components (for example, speed).

In one embodiment, power unit 18 (and/or the consumption of power thereof may be controlled by event sensor(s) 12. In this regard, event sensor(s) 12 may, upon detecting or identifying one or more predetermined events and/or one or more sequence of events (for example, an event that reflects the onset of a fabrication process or stage thereof, event sensor(s) 12 may instruct and/or enable power unit 18 to provide electrical power to the one or more process parameter sensors 14. In addition thereto, or in lieu thereof, event sensor(s) 12 may instruct parameter sensor(s) 14 to change power states from, for example, an off state (or very low power consumption state) to another state, for example, a wait/diagnostic complete state (medium power consumption state) or a fully operational or sensing state (high power consumption state).

The autonomous monitoring device 10 may also include controller 20 to, for example, coordinate the operations and/or functions of the various electronics (for example, event sensor(s) 12 and/or parameter sensor(s) 14) on or in platform or substrate 16. (See, for example, FIGS. 3A–3I). For example, controller 20 may receive data from event sensor(s) 12 and, in response to identifying and/or detecting a predetermined event or sequence of events, provide instructions/commands to parameter sensor(s) 14 and/or power unit 18. In this regard, event sensor(s) 12 provides data (for example, velocity, acceleration and/or position data) to controller 20. The controller 20 may analyze and/or interpret such data to determine and/or detect one or more predetermined events (or sequence of events) of or by the fabrication equipment. In response, controller 20 may instruct, control, enable and/or engage one or more process parameter sensors 14 to sample, sense, detect, characterize, analyze and/or inspect one or more parameters of the fabrication process in real time (for example, temperature, pressure, chemical concentration, fluid flow rate, illumination intensity, image projection, focus, photomask integrity, and/or surface profile).

For example, controller 20 may analyze acceleration or position data (or a sequence of accelerations or positions) from event sensor(s) 12 and determine the onset, commencement, initiation and/or launch of one or more fabrication processes by the integrated circuit fabrication equipment. In response, controller 20 may instruct, control and/or enable one or more process parameter sensors 14 (for example, one or more image sensors as described in the '563 application and the '806 application) to sample, sense, detect, characterize, analyze and/or inspect one or more parameters of the fabrication process (for example, the aerial image of the photomask on the wafer plane during the lithographic process). In this exemplary embodiment, controller 20 may coordinate the sampling of data by process parameter sensors 14 with the exposure and movement operations by the lithographic equipment.

The controller 20 may include or consist of, for example, a microprocessor, state machine, FPGA, DSP and/or ASIC. The controller 20 may also include data storage wherein firmware may reside. Moreover, the data storage may also include calibration data and/or sensor history for autonomous monitoring device 10 as well as components thereof (for example, event sensor(s) 12, process parameter sensor(s) 14 and/or power unit 18).

Notably, controller 20, in addition to identifying and/or detecting a predetermined event or sequence of events, may also coordinate and perform the operation and/or timing of the data communication, data collection and storage, clocking, synchronization, memory management, interface management, inter-chip communication, testing, and/or calibration. In particular, controller 20 may be employed to: (1) interpret and execute the received commands, for example, from the input wired or wireless channel, (2) generate and manage clock signals for other electronics or components on platform or substrate 16 (for example, data compression circuitry and/or wired or wireless transmission, not illustrated, as well as power unit 18), (3) synchronize job start and operations of process parameter sensor(s) 14, (4) monitor the operating conditions of process parameter sensor(s) 14 and autonomous monitoring device 10 (for example, temperature, power, and local current); (5) perform, implement and/or coordinate self-testing of event sensor(s) 12 and/or process parameter sensor(s) 14; (6) store and provide calibration and/or implementation data of the components on autonomous monitoring device 10 (for example, event sensor(s) 12 and/or process parameter sensor(s) 14); (7) store and provide operations information to the components on autonomous monitoring device 10, including commands and operating conditions; and (8) perform and schedule testing of autonomous monitoring device 10 (based, for example, on historical information relating to testing and test results). Indeed, such testing may include statistical process control functions for autonomous monitoring device 10 and provide relevant warning or preventative maintenance requests. Further, based on monitored information, autonomous monitoring device 10, may provide warning messages or emergency shutdown safety functions.

Notably, in certain embodiments, it may be advantageous to employ controller 20 to perform some or all of the real-time analysis of the data from one or more process parameter sensors 14. In this way, autonomous monitoring device 10 is a more complete sensing and analysis device. This may be especially useful when the data analysis is not computationally extensive. Moreover, controller 20 may perform those functions/analyses typically performed by an external computer (not illustrated).

As mentioned above, controller 20 may also perform power management operations or functions of, for example, the sensors, circuitry, components of autonomous monitoring device 10. For example, controller 20 may manage the power consumption of selected circuitry (for example, parameter sensors 14) of autonomous monitoring device 10 based on or in response to identifying one or more predetermined events (and/or one or more sequence of events). In this regard, controller 20 may, prior to detecting and/or identifying one or more predetermined events (and/or one or more sequence of events) using data from event sensor(s) 12, maintain one or more process parameter sensors 14 in a first power state (for example, a low power consumption state). Upon detecting and/or identifying one or more predetermined events (and/or one or more sequence of events), controller 20 may instruct one or more process parameter sensors 14 to change from a first power state to a second power state. That is, upon identifying a second predetermined event, controller 20 may instruct one or more process parameter sensors 14 to change from the second power state to the first power state.

In addition, the power state of one or more event sensors 12 may also be modified according to detecting and/or identifying one or more predetermined events (and/or one or more sequence of events). For example, in an embodiment where autonomous monitoring device 10 is employed in integrated circuit fabrication equipment having, for example, a vacuum chuck, controller 20 may employ a vacuum detection signal from a vacuum sensor (i.e., first event sensor 12*a*). In this regard, the presence of a vacuum, as sensed by vacuum sensor 12*a*, indicates autonomous monitoring device 10 is disposed on the chuck of fabrication equipment. In response, controller 20 may change the operational state of one or more other event sensors 12*b* (for example, a motion sensor, such as an accelerometer, inertial or velocity sensor) from, for example, a first power state (for example, an off or low power consumption state) to a second power state (for example, a high power consumption state, which is indicative of fully operational or data acquisition state).

Notably, in this embodiment, in response to detecting or identifying such one or more additional predetermined events (and/or one or more sequence of events), controller 20 may change the operational state of one or more (or selected) process parameter sensors 14 to a data acquisition or collection state (i.e., a high power consumption state). In this way, one or more process parameter sensors 14 acquire, record, sense, sample and/or collect information, for example, under the control of controller 20 and the overall power consumption of autonomous monitoring device 10 is more efficiently managed.

With reference to FIGS. 3F–3I, in another embodiment, autonomous monitoring device 10 includes communications circuitry 22 to provide wireless, wired and/or optical communications features. Where autonomous monitoring device 10 employs wired communication techniques, communications circuitry 22 may include a socket or connector that may be disposed on substrate or platform 16. The socket or connector may be an electrical connector that includes signal, power and/or ground pins, where signals are transmitted by series of high and low voltages, using proprietary or non-proprietary protocols (for example, RS-232).

In those embodiments where autonomous monitoring device 10 includes communications circuitry for real-time communication of, for example, data which is representative of the time sequence of a measured parameter, autonomous monitoring device 10 facilitates real-time feedback—that is, real-time adjustment, tuning, and/or control of the process and/or fabrication equipment. For example, where autonomous monitoring device 10 is employed to measure film thickness during CMP, autonomous monitoring device 10 may provide feedback, in real time, of film thickness distribution across the surface of platform or substrate 14 measured by one or more parameter sensors 14 of autonomous monitoring device 10. These embodiments may allow fabrication equipment to adjust the pressure for certain areas of the wafer, or stop processing when the polishing reaches or achieves a desired specification.

In certain embodiments, wireless communication methods may minimize disruption to the operation of the fabrication equipment. This is particularly the case in those situations where fabrication equipment does not include communications circuitry 22 and where the autonomous monitoring device 10 is under processing constraints that, as a practical matter, prohibit compromising the environment of those constraints.

In those embodiments facilitating real-time data acquisition and/or analysis, autonomous monitoring device 10 may be employed to enhance or optimize the yield of the fabrication equipment as well as the quality, yield and cost of integrated circuits fabricated using that equipment. The control loop from the fabrication equipment to parameter sensor(s) 14, then to a computer (which process the data and/or determines corrective or responsive measures), then back to the equipment, is a type of control loop that facilitates enhancement or optimization of the processes and/or the fabrication equipment. In this regard, autonomous monitoring device 10 of this embodiment may allow or facilitate intermittent, periodic and/or continuous tuning and/or adjustment of the fabrication equipment and/or the process. That is, the fabrication equipment and/or the process may be tuned or adjusted when autonomous monitoring device 10 enters and exits the equipment as well as undergoes processing by that equipment.

Notably, additional circuitry may be implemented to accommodate bandwidth considerations of communications circuitry 22. For example, communications between autonomous monitoring device 10 and an external device (for example, a computer) may be via optical, wired and/or wireless of a given bandwidth that may not be as high as the bandwidth of the data collection by the sensors. As such, suitable circuitry (for example, data compression circuitry (not illustrated) to compress the data and/or to buffer the data) may be implemented on or in autonomous monitoring device 10 to accommodate the given communications techniques.

The autonomous monitoring device 10 of the present invention may include data storage (not illustrated) to store and maintain data from event sensor(s) 12 and parameter sensor(s) 14 sensed, sampled, measured and/or collected while in operation. For example, parameter sensor(s) 14 may sense, sample, measure and/or collect discrete data, or data which is representative of the time sequence, of certain measurements, and store that data in data storage, for example, a solid state memory such as RAM or Flash memory, for later retrieval or transmission after or during data collection/acquisition. The stored data may be retrieved from autonomous monitoring device 10 via a communications link, which itself may be implemented using wireless, wired and/or optical techniques, as described above.

Notably, in certain embodiments, the data may be downloaded from autonomous monitoring device 10 in real-time (or nearly real-time) via a communications circuitry 22 to an external device, such as a computer (not illustrated) or an external data storage device (not illustrated). This real-time (or near-real-time) communications link may be implemented using wireless, wired and/or optical techniques.

All of the power management techniques described above may also be employed to manage the power consumption of communications circuitry 22 and data storage 24. For example, controller 20 may change the operational state of communications circuitry 22 in response to detecting or identifying one or more predetermined events (and/or one or more sequence of events) and/or in response to feedback from parameter sensors 14 (for example, indicating that the data acquisition sequence has commenced or concluded). For the sake of brevity, the power management techniques described above will not be repeated in connection with communications circuitry 22 and/or data storage 24 (and/or any other circuitry/electronics disposed on autonomous monitoring device 10).

As mentioned above, in certain embodiments autonomous monitoring device 10 includes substrate 16 having a shape that is the same or substantially the same as a production-type wafer and/or a shape that is capable of being handled by the fabrication equipment (for example, with little to no modification to the equipment and/or the software thereof). With reference to FIGS. 4A–4D, substrate 16 may be designed and autonomous monitoring device 10 may be configured to be disposed within integrated circuit fabrication equipment with little or no modification to the equipment and/or thereby experience the same or substantially the same environment/process as a production-type wafer (i.e., a wafer having actual integrated circuits fabricated thereon). In certain embodiments, as mentioned above, sensors 12 and 14, and other circuitry and/or components (power unit 18) of autonomous monitoring device 10, communications circuitry 22, data storage 24 (for example, RAM, ROM, and non-volatile memory such as Flash memory), may protrude from the surface(s) of substrate 16. Under these circumstances, the topology of autonomous monitoring device 10 may be neither flat nor uniform. As such, autonomous monitoring device 10 may have a different topology than a typical production-type wafer. Thus, in certain embodiments, the autonomous monitoring device 10 includes a platform and/or substrate that has a sufficiently similar form factor and/or profile as a production-type wafer, may be handled (automatically or manually) like a production-type wafer, and/or may be employed or disposed in the appropriate processing equipment with little or no change to the typical configuration of the fabrication equipment.

The electrical power of autonomous monitoring device 10 illustrated in FIGS. 4A–4D may be provided by batteries 26a and 26b. In this regard, batteries 26a and 26b may be a primary source of electrical power and thereby may provide all or substantially all of the power requirements of autonomous monitoring device 10. The batteries 26a and 26b may be rechargeable, for example, lithium-ion based batteries and/or polymer based batteries.

The batteries 26a and 26b may be customized to accommodate the shape and profile constraints of the wafer or wafer-like shaped embodiments of autonomous monitoring device 10. Further, batteries 26a and 26b may be disposed in cavities, holes or cut-outs in platform or substrate 16 in order to minimize the profile of autonomous monitoring device 10. Thus, batteries 26a and 26b may include a thin form factor to be disposed on or embedded into autonomous monitoring device 10. In this way, autonomous monitoring device 10 may be more readily implemented in, for example, lithographic equipment as a self-contained and/or self-sufficient sensing device without the need of electrical connection to lithographic equipment or elsewhere.

Notably, electrical power may be provided either via wired or wireless techniques to autonomous monitoring device 10. For example, electrical power may be obtained directly or indirectly from the fabrication equipment (not illustrated).

With continued reference to FIGS. 4A–4D, autonomous monitoring device 10 may also include event sensor(s) 12, parameter sensor(s) 14, controller 20, communications circuitry 22, and data storage 24. The event sensor(s) 12, parameter sensor(s) 14, controller 20, communications circuitry 22, and data storage 24 may be incorporated on autonomous monitoring device 10 as discrete components or may be integrated in substrate 16 (via VLSI or LSI integration techniques), or a combination thereof (for example, parameter sensor(s) 14 is/are integrated in substrate 16, and controller 20 and data storage 24 are discrete components). In those circumstances where the electronics of autonomous monitoring device 10 is/are comprised of discrete components, it may be advantageous to employ surface mount technologies, unpackaged die and/or cavities, holes or cut-outs in substrate 16 in order to further minimize the profile of autonomous monitoring device 10.

With reference to FIGS. 4C and 4D, an external computing device 28 may be employed as a control or operator console as well as a data analysis and parameter processing device. The external computing device 28 may store algorithms and software that process the data representative of the parameter under investigation, for example, an aerial image of a photomask, which is received from parameter sensor(s) 14. The external computing device 28 may also extract information, manage data storage, and/or interface with users/operators. The external computing device 28 may be located near or next to the integrated circuit fabrication equipment (for example, lithographic equipment) or in another locale, which is remote from the fabrication equipment. As mentioned above, autonomous monitoring device 10 may communicate with external computing device 28 using wired, wireless and/or optical techniques.

It should be noted that some or all of the real-time data analysis may be performed by circuitry and devices resident on autonomous monitoring device 10, for example, by controller 20. As such, external computing device 28 may be superfluous. It may be advantageous to employ this embodiment when the data analysis is not too computationally extensive.

With reference to FIGS. 5A–5C, autonomous monitoring device 10 may include one or more event sensors 12$a$–$c$ that provide data to controller 20 to detect or identify one or more predetermined events. For example, first event sensor 12$a$ (i.e., a vacuum sensor) may provide data which is representative of the presence or absence of a vacuum on the backside of substrate 16 and second event sensor 12$b$ (i.e., an accelerometer) to provide data which is representative of acceleration and deceleration of autonomous monitoring device 10. The controller 20 may employ data from the accelerometer to detect a predetermined acceleration profile or signature that is representative of the onset, commencement, initiation and/or launch of fabrication process by the fabrication equipment. In response thereto, one or more process parameter sensors (for example, an image sensor as described and illustrated in the '806 application) may sample, sense, detect, characterize, analyze and/or inspect one or more parameters of the process in real time (i.e., during the fabrication process).

Notably, event sensors 12 may measure or sense, for example, acceleration, motion, velocity, inertial, vacuum, temperature and/or illumination. Indeed, any sensor that detects a change in an attribute and/or the environment of autonomous monitoring device 10 (and may be disposed on or in autonomous monitoring device 10) whether now known or later developed is intended to come within the scope of the present invention. For example, with reference to FIG. 5A, autonomous monitoring device 10 may also include event sensors 12$c_1$ to 12$c_4$ to detect the presence or absence of illumination (for example, radiation in the ultraviolet or extreme ultraviolet wavelength range) within a predetermined range of wavelengths. The event sensors 12$c_1$ to 12$c_4$ may be temperature sensors that indirectly detect the presence or absence of illumination based on a change in temperature.

Moreover, with reference to FIG. 5B, autonomous monitoring device 10 may include one or more rows of optical sensors 12C to detect dark current and/or temperature variations/changes. Such optical sensors 12C may be integrated with an image sensor 14 (for example, a photodiode-CCD array).

The present invention may employ sensors 12 and 14 that are fabricated and implemented using any techniques that are now known or later developed. All such techniques are intended to fall within the scope of the present invention. For example, motion, acceleration, velocity and/or position sensors may be fabricated using MEMS technologies. Further, with reference to FIGS. 5A–5C and 6A, vacuum sensor 12$a$ may be implemented using a reed-type value configuration. In this regard, reed-type value 30 over a hole or void in platform or substrate 16. In the presence of a vacuum, reed-type value 30 makes physical communicates with electrical contact 34, which is disposed on printed circuit board 36. By completing the circuit, controller 20 detects or identifies the existence of a vacuum on surface 38 (i.e., the back surface) of substrate 16

The vacuum sensor may also be implemented using MEMS pressure sensor 40 which detects a differential in pressure between surface 40$a$ and 40$b$. Indeed, as mentioned above, sensors 12 and 14 of the present invention may be fabricated and implemented using techniques that are now known or later developed, all of which are intended to fall within the scope of the present invention.

Figure 6C:
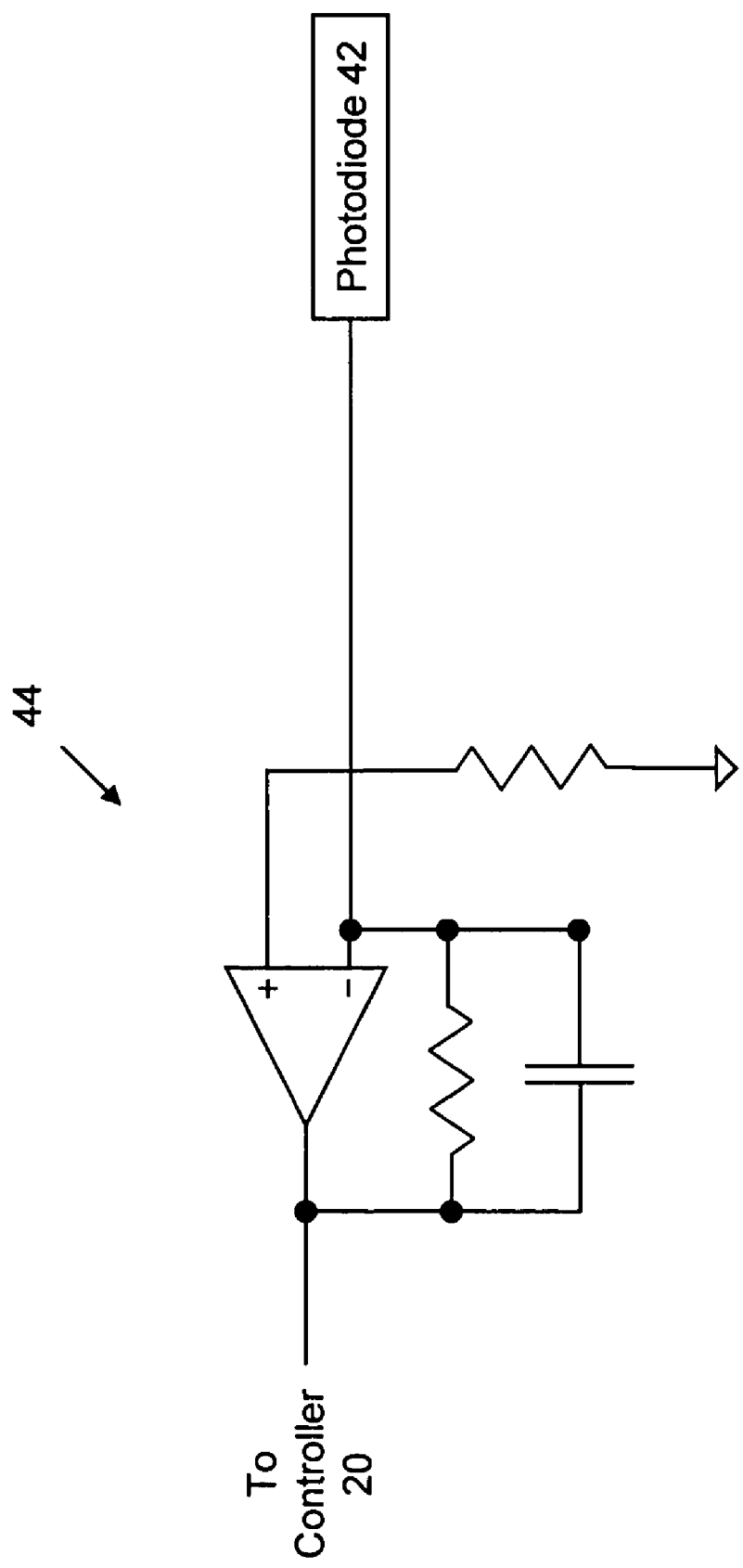
FIG. 6C is an exemplary illustration of an optical sensor.

Notably, an optical sensor may be implemented using many different techniques as well as circuit configurations. For example, with reference to FIGS. 5A, 5C and 6C, optical sensor 12$c$ may employ photodiode 42 connected to level detection circuitry 44 as illustrated in FIG. 6C. The controller 20 detects or identifies the event based on the output (or sequence of outputs) of level detection circuitry 44.

As mentioned above, controller 20 receives data from one or more event sensors 12 (for example, data which is representative of, for example, temperature, illumination, motion, acceleration, velocity and/or position) to identify or detect one or more predetermined events (and/or one or more sequence of events). In this regard, controller 20 may analyze the data on the basis of one or more parameters or criteria to identify or detect the predetermined event(s) (and/or one or more sequence of events). The one or more predetermined events (and/or one or more sequence of events) may indicate the onset, commencement, initiation and/or launch of one or more fabrication processes (or sub-processes) by the fabrication equipment. As such, controller 20 may implement an algorithm, including one or more parameters or criteria, to identify or detect the one or more predetermined events from the data received from one or more event sensors 12.

Upon identifying the one or more predetermined events (and/or sequence of events), controller 20 enables, instructs and/or engages one or more process parameter sensors 14 to sample, sense, detect, characterize, analyze and/or inspect one or more parameters of the fabrication process(es) in real time (for example, temperature, pressure, chemical concentration, fluid flow rate, illumination intensity, image projection, focus, photomask integrity, and/or surface profile). The controller 20 may employ many different and diverse techniques, algorithms and/or criteria to identify or detect one or more predetermined events (and/or one or more sequence of events) using the data from one or more event sensors 12 (for example, data which is representative of illumination, motion, acceleration, velocity and/or position (relative or absolute). All techniques, algorithms and/or criteria, whether now known or later developed, are intended to fall within the scope of the present invention.

Figure 7:
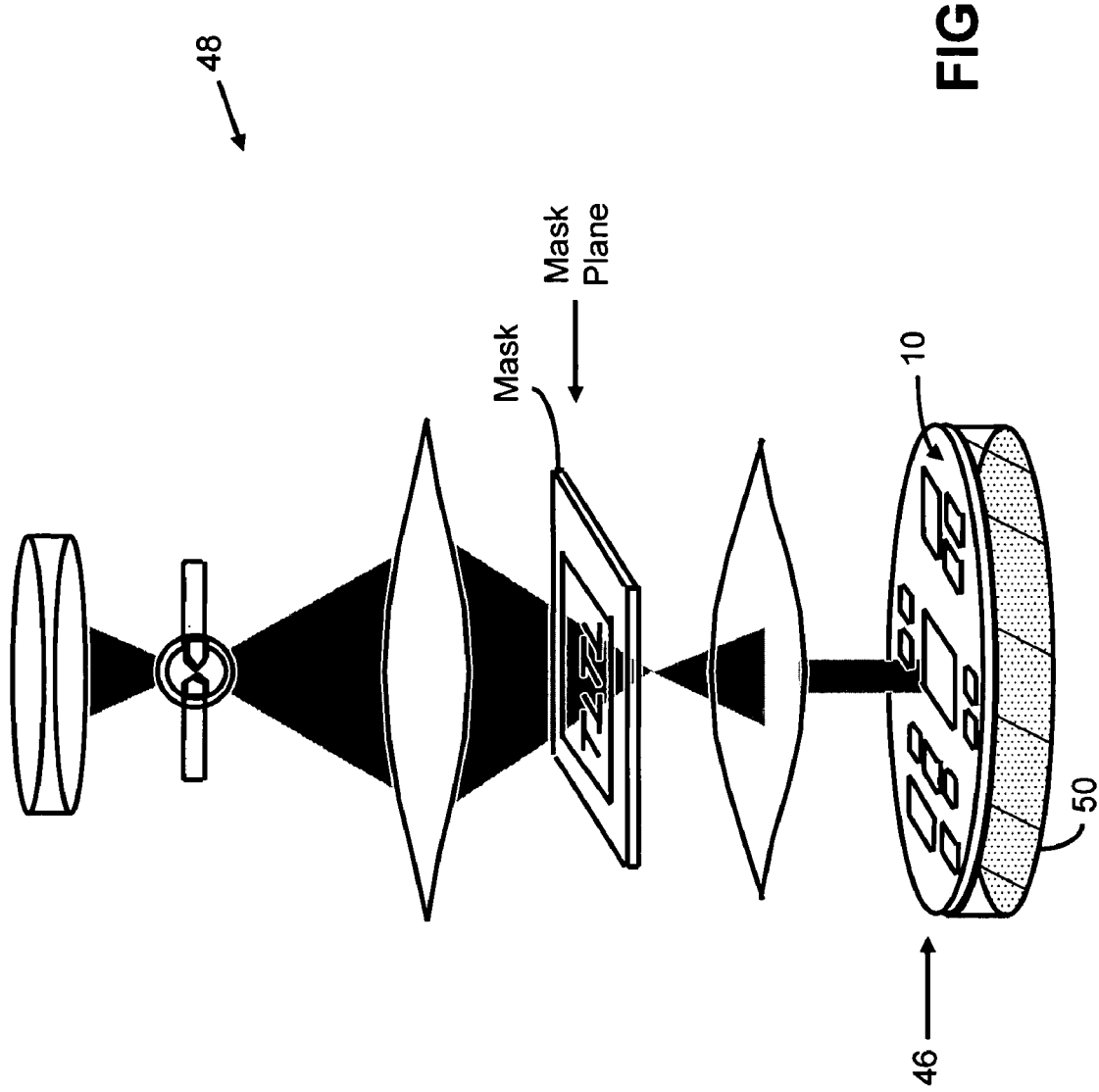
FIG. 7 is a block diagram representation of a optical lithographic system (for example, a stepper or scanner) used in the fabrication process of an integrated circuit, in conjunction with autonomous monitoring device according to at least one embodiment of the present invention.
Figure 8:
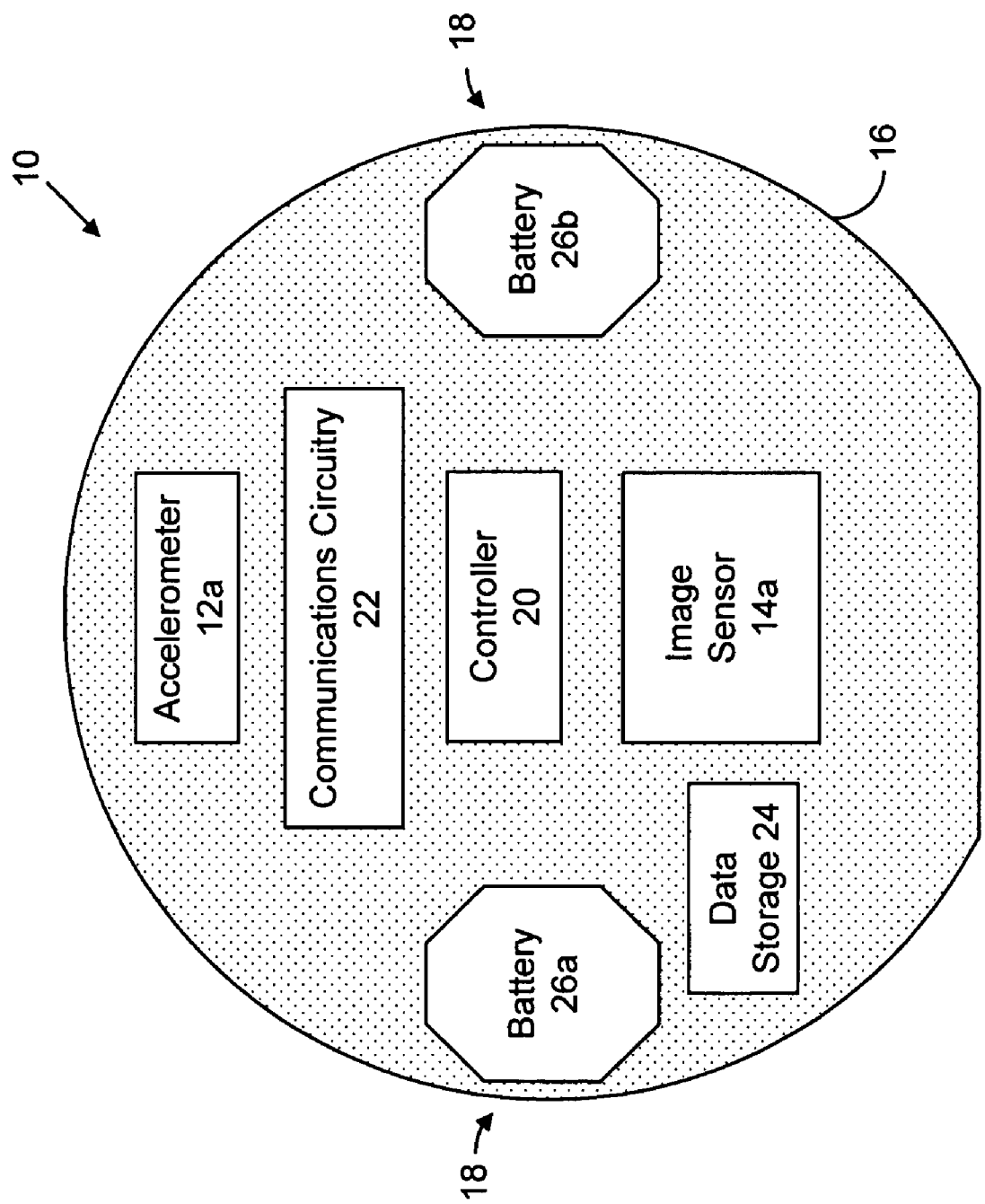
FIG. 8 is a schematic representation of an autonomous monitoring device having an accelerometer event sensor and an image sensor (illumination sensor array) process parameter sensor.

For example, with reference to FIGS. 7 and 8, in one embodiment, autonomous monitoring device 10 includes image sensor 14$a$ (i.e., process parameter sensor) of the type described and illustrated in the '806 application to directly sense, sample and/or measure the light intensity and image patterns of the aerial image that is projected on wafer plane 46 of lithographic equipment 48. In this embodiment, autonomous monitoring sensor 10 is disposed on wafer stage 50 (i.e., wafer chuck) of lithographic equipment 48 (for example, a scanner) and includes accelerometer 12$a$ (i.e., event sensor) that provides data which is representative of changes in acceleration of autonomous monitoring device 10 (which is representative of changes in acceleration of the wafer stage of the lithographic equipment). Thus, in this exemplary embodiment, controller 20 receives data which is representation of acceleration of wafer stage 50 from accelerometer 12a (i.e., event sensor) and, after identifying or detecting a predetermined event (for example, the onset, commencement, initiation and/or launch of a lithographic illumination sequence), enables or engages image sensor 14a (i.e., process parameter sensor) to collect, sense, sample and/or measure light intensity data of the aerial image that is projected on wafer plane 46 by lithographic equipment 48.

Figure 9:
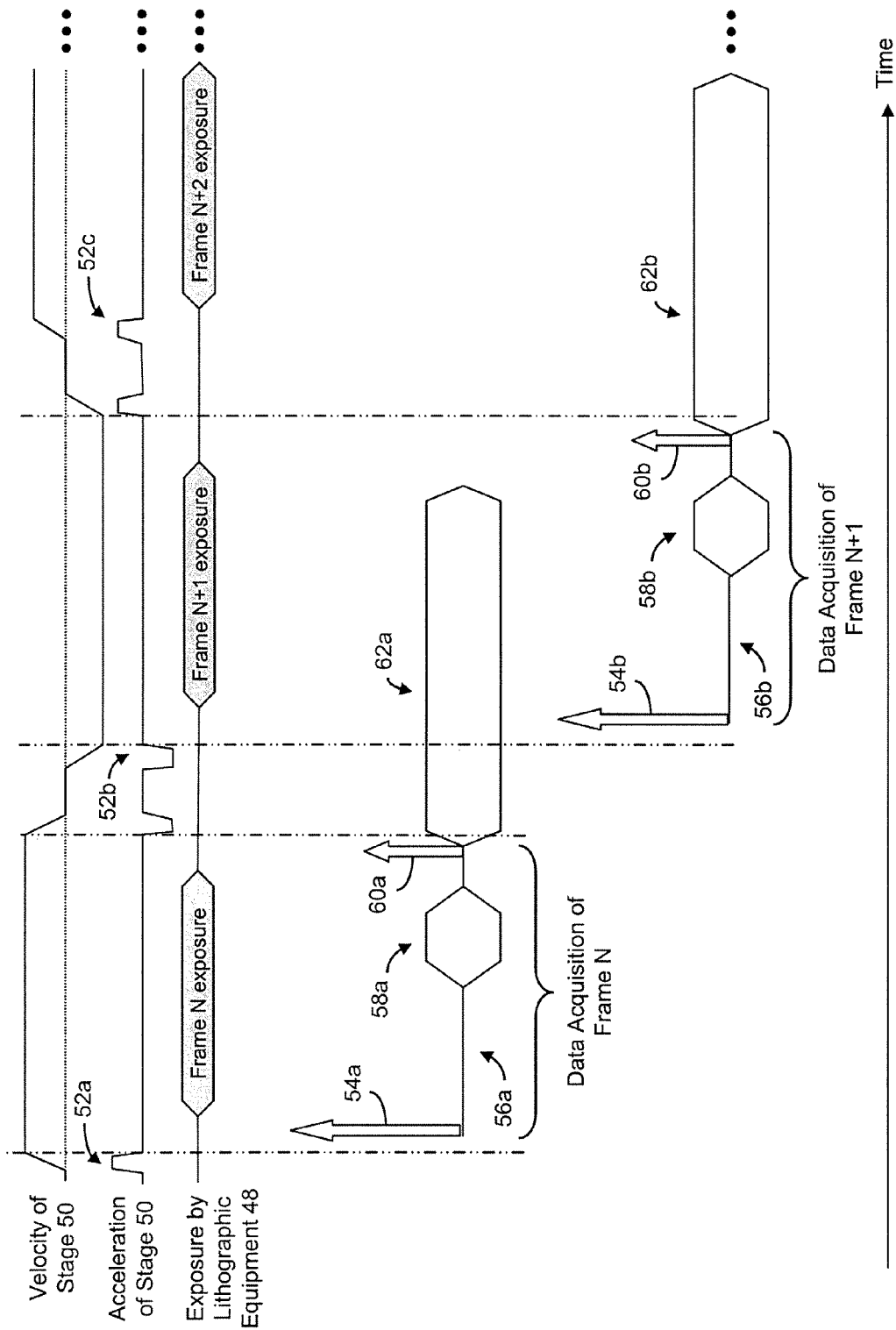
FIG. 9 illustrates a timing diagram of the wafer stage velocity and acceleration profile for an optical lithographic equipment (for example, a scanner), correlated with an image exposure period and suitable timing of the image acquisition of a parameter sensor of one exemplary embodiment of autonomous monitoring device according to an aspect of the present invention.
Figure 10:
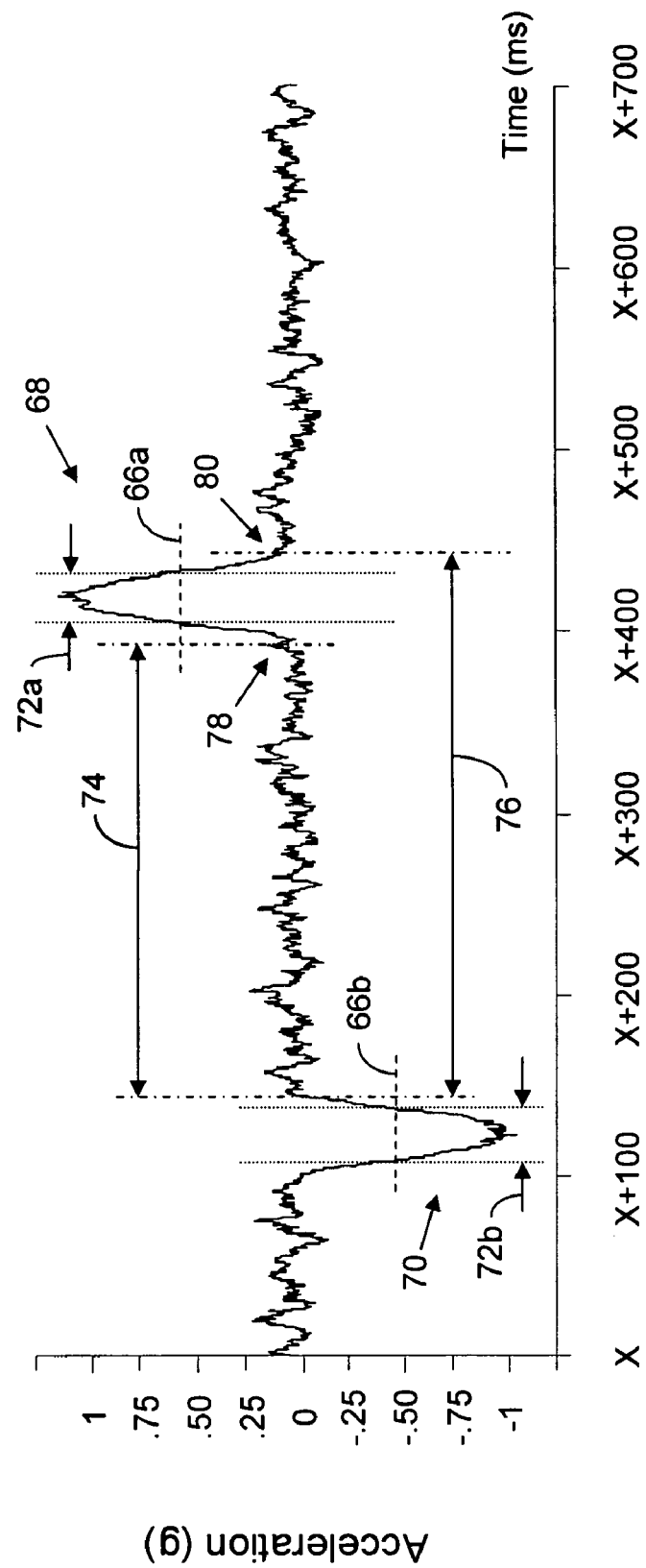
FIG. 10 illustrates the acceleration, over time, of an optical lithographic equipment (for example, scanner), in conjunction with a plurality of criteria or trigger parameters that may be employed by a controller of autonomous monitoring device according to an aspect of the present invention.

With reference to FIG. 9, upon identifying or detecting first predetermined event 52a (based on analysis of the data from accelerometer 12a) that indicates lithographic equipment 48 is to project a portion of the aerial image on wafer plane 46 (i.e., a predetermined event), controller 20 instructs image sensor 14a to activate its electronic shutter at 54a. In response, image sensor 14a acquires, collects, senses, samples and/or measures the intensity of the illumination for frame N at 56a. Prior to transferring the charge to an internal CCD of image sensor 14a, any residual accumulated charge in the internal CCD is removed at 58a. Thereafter, the intensity data (collected, sensed, sampled and/or measured by the individual photodiodes of image sensor 14a) is provided to the internal CCD at 60a and subsequently provided to data storage 24 (for example, DRAM, SRAM and/or Flash memory) at 62a.

With continued reference to FIG. 9, controller 20 continues to receive data which is representative of the acceleration of wafer stage 50 and, based on a plurality of criteria or triggering parameters, identifies or detects second predetermined event 52b (based on analysis of the data). The second predetermined event 52b is representative of an illumination by lithographic equipment 48 of another portion of the aerial image on wafer plane 46 after moving wafer stage 50 relative to the projected aerial image. In response, controller 20 instructs image sensor 14a to activate its electronic shutter at 54b. Thereafter, image sensor 14a acquires, collects, senses, samples and/or measures the intensity of the illumination for frame N+1 at 56b. As before, prior to transferring the charge of the individual photodiodes to an internal CCD of image sensor 14a, any residual accumulated charge in the internal CCD is removed at 58b. Thereafter, the intensity data is provided to the internal CCD at 60b and subsequently provided to data storage 24 (for example, DRAM, SRAM and/or Flash memory) at 62b.

Notably, the process may continue for one, some or all of the frames to be collected. Details of various data acquisition techniques and applications are discussed and illustrated in detail in the '806 application, which, as mentioned above, are incorporated by reference herein in its entirety.

The controller 20 of this embodiment determines the appropriate timing to enable image sensor 14a to capture a frame of data by "filtering" the data (acceleration/decelerations) to identify the predetermined events and/or sequences of events. In this regard, controller 20 may employ a suitable algorithm and plurality of criteria or trigger parameters to enable or engage the image sensor (i.e., parameter sensor 14) at the appropriate time to capture, measure, sample and/or collect the light intensity data of the aerial image that is projected on the wafer plane by the lithographic equipment. In one exemplary embodiment, controller 20 employs one or more of the following criteria or trigger parameters: (1) acceleration filter coefficient (i.e., the signal filter coefficient for the accelerometer output data), (2) positive acceleration threshold (i.e., a threshold to be exceeded on the positive acceleration signal to be considered "valid"), (3) negative acceleration threshold (i.e., a threshold to be exceeded on the negative acceleration signal to be considered "valid"), (4) minimum acceleration time (i.e., the minimum amount of time of acceleration to be considered "valid"), (5) maximum acceleration time (i.e., the maximum amount of time of an acceleration to be considered "valid"), (6) acceleration hysteresis (i.e., a transitional threshold to exclude multiple detections introduced by noise), (7) minimum exposure time (i.e., the minimum amount of time between exposure scan acceleration and deceleration to be considered "valid"), and (8) maximum exposure time (i.e., the maximum amount of time between exposure scan acceleration and deceleration to be considered "valid"). The controller 20 may employ one or more of the aforementioned criteria or trigger parameters, in the suitable algorithm, to identify the appropriate time to engage or enable the image sensor to collect illumination data. In this way, controller 20 may (i) coordinate the measurement and recording illumination data with the onset, commencement, initiation and/or launch of the actual lithographic process and (ii) discriminate, for example, between calibration routines of wafer stage 50 (and movement thereof and the onset, commencement, initiation and/or launch of the actual lithographic process.

Figure 11A:
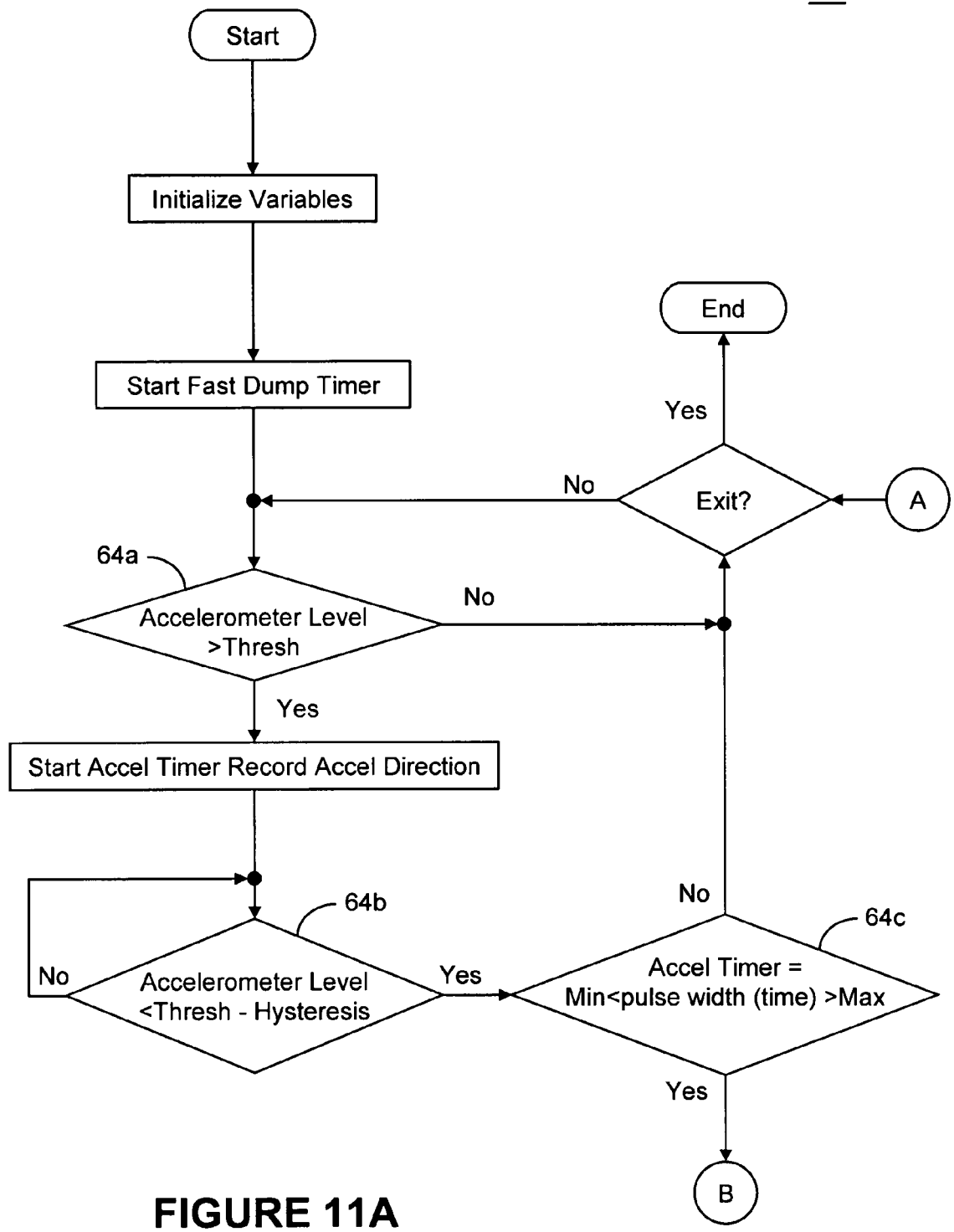
FIGS. 11A–11C is a flow diagram of an exemplary algorithm, implemented by a controller, to detect or identify the appropriate timing of the image acquisition of the parameter sensor of an autonomous monitoring device according to certain exemplary embodiments of the present invention.
Figure 11B:
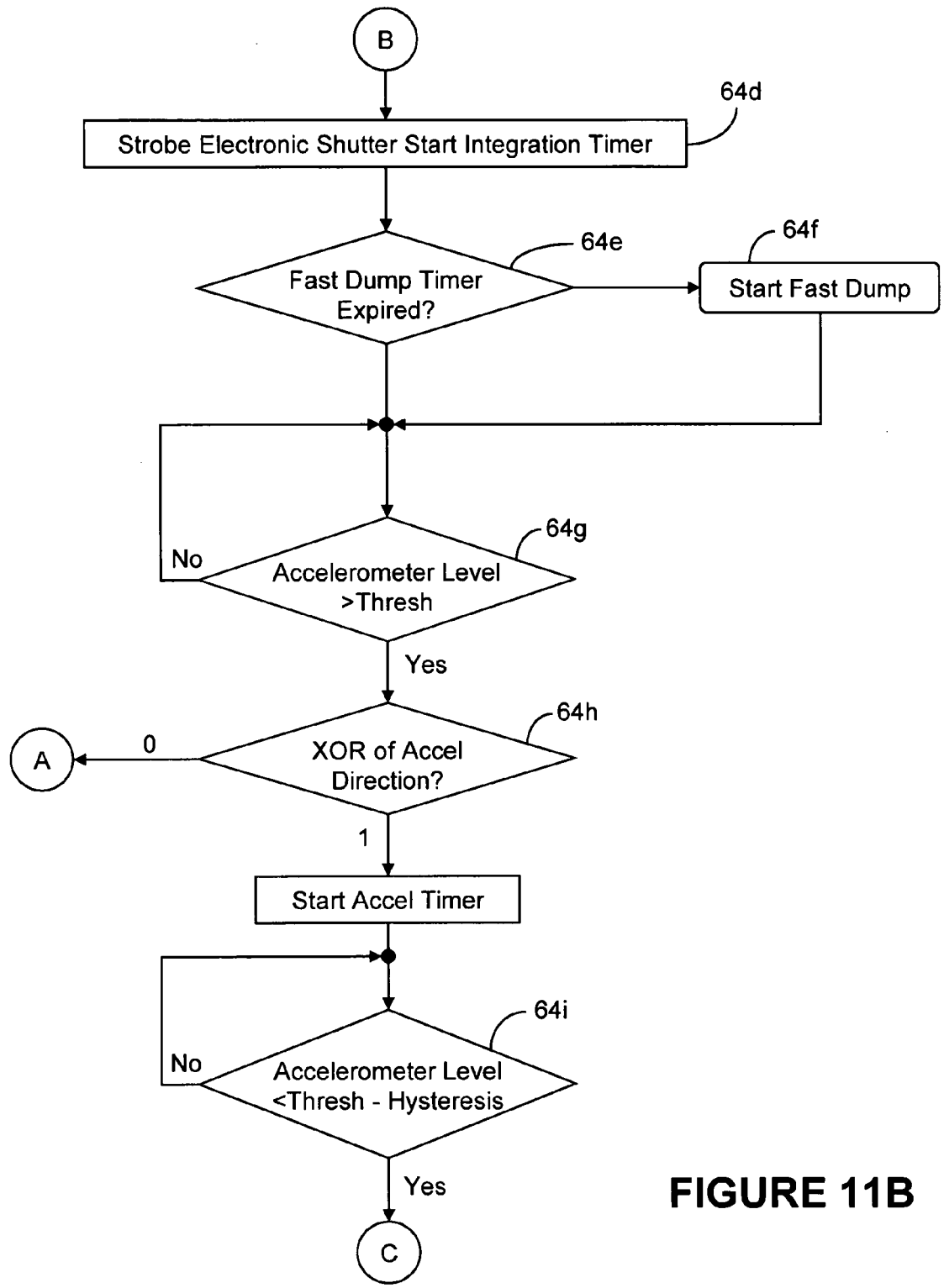
Figure 11C:
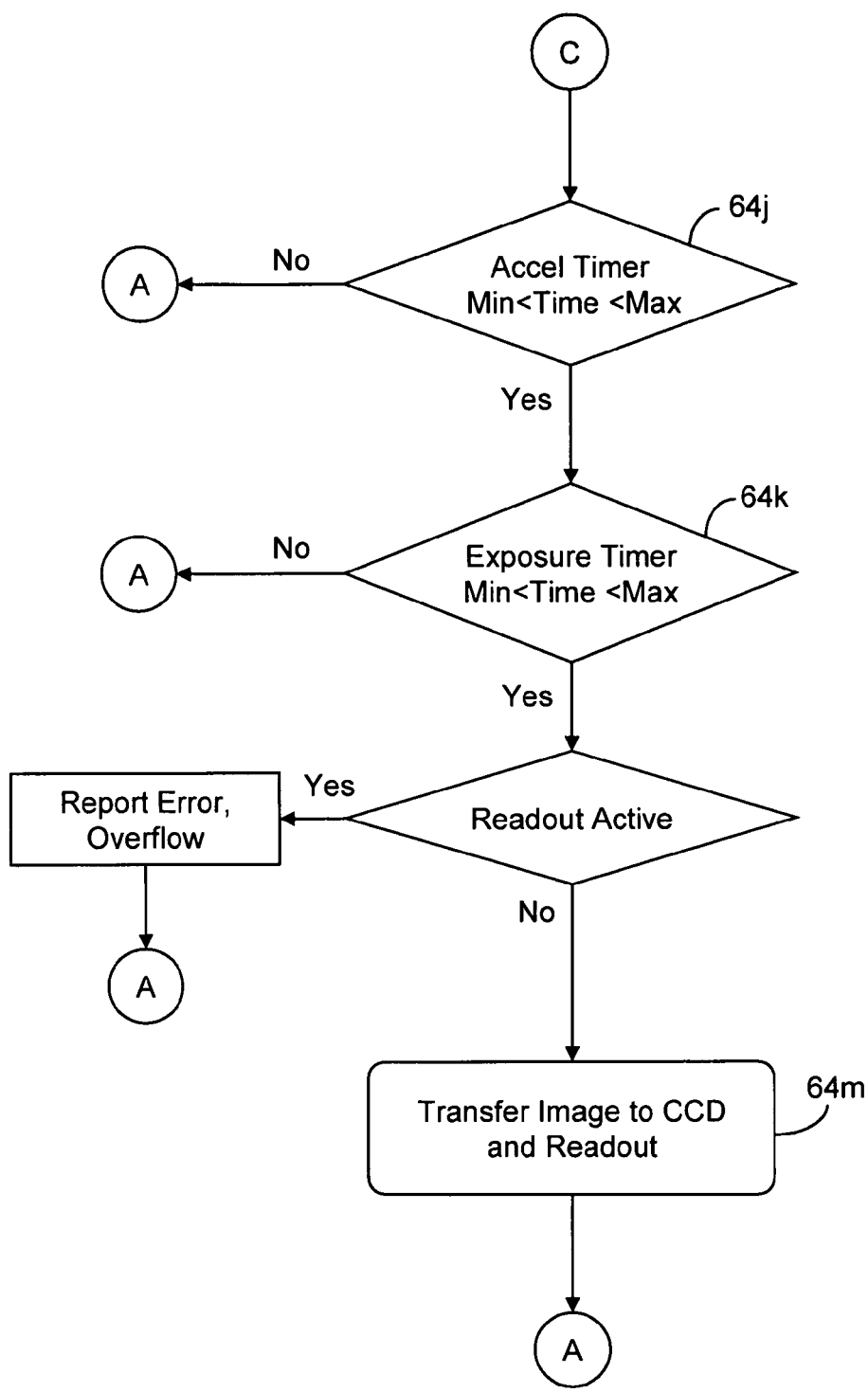

In particular, with reference to FIGS. 10 and 11A–11C, in one exemplary embodiment, controller 20 analyzes the data which is representative of the acceleration of wafer stage 50 based on a plurality of criteria or triggering parameters using algorithm 64 described in FIGS. 11A–11C. In this exemplary embodiment, after initialization, controller 20 receives the data from accelerometer 12a and compares the amplitude (accelerometer level) to a threshold ("Thresh") at 64a of FIG. 11A. In this exemplary embodiment, the threshold is approximately 50% of the peak amplitude—that is, threshold 66a for the positive pulse 68 is approximately 50% of the maximum amplitude of positive pulse 68 (acceleration) and threshold 66b is approximately 50% of the minimum amplitude of the negative pulse 70 (deceleration). Notably, the peak amplitude may be determined based on simulation data, empirical data, or measured historical data and the threshold based on a number of criteria including, for example, the desired degree of confidence of identifying a predetermined event or sequence of predetermined events.

Where the amplitude of the data is greater than the threshold, controller 20 determines whether width 72a and 72b of pulses 68 and 70, respectively, is within a predetermined range in order to confirm that the validity of pulses 68 and 70. (See 64b and 64c of FIG. 11A). In this regard, a typical pulse width, measured from approximately the midpoint of the pulse, may be determined using simulation data, empirical data, or measured historical data. In this example, algorithm 64 employs a minimum pulse width of about one half of the typical pulse width and a maximum pulse width of about twice the typical pulse width. As such, with reference to FIG. 10, a suitable minimum pulse width is about 15 ms and a suitable the maximum pulse width is about 60 ms. Notably, the determination of the pulse width employs the threshold hysteresis variable (i.e., Hysteresis) to minimize the potential of falsely or inadvertently determining an erroneous pulse width due to, for example, noise.

Upon detecting a predetermined event, controller 20 instructs image sensor 14a to strobe its electronic shutter and start to acquire, collect, sense, sample and/or measure the intensity of the illumination incident thereon. (See 64d of FIG. 11B). Thereafter, residual accumulated charge in an internal CCD is removed at 64e and 64f.

The controller 20 measures the amplitude of the data which is representative of the acceleration of wafer stage 50 (and autonomous monitoring device 10) to determine or identify another predetermined event (i.e., another pulse), for example, pulse 68. (See 64g of FIG. 11B). This second predetermined, in combination with the first predetermined event is a sequence of predetermined events. As before, controller 20 analyzes the acceleration data to determine whether the acceleration exceeds threshold 66a. Where the amplitude is greater than threshold 66a (Thresh), controller 20 determines whether pulses 68 and 70 are opposite in magnitude which would represent a deceleration-acceleration combination. (See 64h of FIG. 11B). In this way, controller 20 determines whether the motion of wafer stage 50 is indicative of a scan operation rather than, for example, a turnaround motion or an initialization routine. If decision 64h reveals either an acceleration-acceleration combination or deceleration-deceleration combination, the routine starts from the beginning since the motion of wafer stage 50 is not indicative of a scan operation.

In the event that controller 20 determines that the motion of wafer stage 50 (i.e., autonomous monitoring device 10) is consistent with the response of a scan operation at 64h, controller 20 again determines whether width 72a of pulses 68, for example, is within a predetermined range in order to confirm that the validity of pulse 68. (See 64i of FIG. 11B and 64j of FIG. 11C). As mentioned above, a typical pulse width, measured from approximately the midpoint of the pulse, may be determined using simulation data, empirical data, or measured historical data. Moreover, as before, the determination of the pulse width employs the threshold hysteresis variable (i.e., Thresh-Hysteresis) to minimize the potential of falsely or inadvertently determining an erroneous pulse width due to, for example, noise.

Where controller 20 determines the pulse is "valid", controller 20, in this exemplary embodiment, analyzes whether the exposure time is within a predetermined range at 64k of FIG. 11C. (See, minimum exposure time 74 and maximum exposure time 76 on FIG. 10). The predetermined range of the exposure time may be determined based on simulation data, empirical data, or measured historical data. In this exemplary embodiment, (1) minimum exposure time 74 is equal to the measured time between pulses 68 and 70 (measured at 78) minus 20 ms and (2) maximum exposure time 76 is equal to the measured time between pulses 68 (measured at 80) and 70 plus 20 ms.

Upon identifying or detecting a valid scan operation of lithographic equipment 48, controller 20 instructs image sensor 14a to transfer the intensity data (measured by the array of photodiodes) to the internal CCD at 64m and subsequently provided to data storage 24 (for example, DRAM, SRAM and/or Flash memory).

Notably, the number and type of variables and/or detection parameters employed by controller 20 may impact the degree of confidence of identifying a predetermined event or sequence of predetermined events. Moreover, the algorithms, techniques and criteria employed by controller 20 may vary depending on the expected events and/or parameters of the fabrication process and/or equipment under analysis or investigation by autonomous monitoring device 10. Indeed, controller 20 may employ algorithms, variables and/or detection parameters that are pre-programmed or programmable (via, for example, the operator and/or user). Such algorithms, variables and parameters may be provided to controller 20 (after fabrication and/or after insertion into the fabrication equipment) via, for example, communications circuitry 22.

The variables or parameters may be pre-programmed or programmable using, for example, empirical data, simulation data or historical data. Moreover, controller 20 may control or determine the variables or parameter(s) and any incremental change of the variables or parameter(s) to enhance the operation of autonomous monitoring device 10. In this embodiment, controller 20 may include the ability to teach itself suitable variables or parameters (i.e., self-taught functionality) or the ability to determine appropriate modifications to the variables or parameter(s) in order to, for example, enhance the operation of autonomous monitoring device 10.

There are many inventions described and illustrated herein. While certain embodiments, features, materials, configurations, attributes and advantages of the inventions have been described and illustrated, it should be understood that many other, as well as different and/or similar embodiments, features, materials, configurations, attributes, structures and advantages of the present inventions that are apparent from the description, illustration and claims. As such, the embodiments, features, materials, configurations, attributes, structures and advantages of the inventions described and illustrated herein are not exhaustive and it should be understood that such other, similar, as well as different, embodiments, features, materials, configurations, attributes, structures and advantages of the present inventions are within the scope of the present invention.

For example, while the present invention(s) is described generally in the context of integrated circuit fabrication, the present invention(s) may be implemented in processes to manufacture other devices, components and/or systems including, for example, hard disk drives, magnetic thin-film heads for hard disk drives, flat panel displays, printed circuit boards. Indeed, the present invention(s) may be employed in the fabrication of any devices, components and/or systems, whether now known or later developed, that may benefit from the present invention(s).

In addition, as mentioned above, autonomous monitoring device 10 may include one, some or all of event sensors 12 and/or parameter sensors 14 described herein. Moreover, autonomous monitoring device 10 according to the present invention may include one or more of the same or different event sensors 12 and/or parameter sensors 14 (and associated electronics). Indeed, implementing one type of sensor may provide information that permits or facilitates detection, sampling, measuring, and/or monitoring of more than one parameter (for example, temperature, pressure and/or fluid flow rate). Thus, all combinations and/or permutations of event sensors 12 and/or parameter sensors 14 are intended to be within the scope of the inventions.

Further, while the event sensor(s) and the parameter sensor(s) have been described as distinct or separate physical sensors, the event sensor and parameter sensor may be the same physical device. That is, the sensor that samples and/or collects data which is used to initiate or trigger the collection of data which is representative of the operating parameter(s), may also sense, sample and collect process data. For example, the triggering thresholds (based, for example, on the algorithm executed by controller 20) and sequencing qualifies valid data from invalid.

Further, autonomous monitoring device 10 according to the present invention may include event sensors 12 and/or parameter sensors 14 that are integrated into or onto the substrate, or disposed thereon (in the form of discrete devices), or combinations thereof. For example, autonomous monitoring device 10, according to one embodiment of the present invention, may include an integrated temperature or pressure sensor(s) (i.e., event sensor(s)) 12) and discrete image sensor(s) (parameter sensor(s) 14).

Further, autonomous monitoring device 10 according to the present invention may be configured to simultaneously or serially sense, sample, detect, measure, and/or monitor information on the processing environment and/or processing progress during fabrication. For example, autonomous monitoring device 10, according to one embodiment of the present invention, may (simultaneously or serially) detect, sample, measure, and/or monitor temperature and pressure using the same sensor or a plurality of the same or different sensors (one or more of the same or different sensors dedicated to temperature and one or more of the same or different sensors dedicated to pressure). In this way, such autonomous monitoring device 10, addresses temperature and pressure operating parameters, which may be two critical processing conditions for certain processing steps.

Moreover, autonomous monitoring device 10 according to the present invention may be programmed to provide the sensed, sampled and/or detected data which is representative of, for example, the processing environment during the actual process, thereafter, or a combination thereof. For example, autonomous monitoring device 10 according to one embodiment of the present invention may detect, sample, measure, and/or monitor temperature and pressure of a given process using (1) a temperature sensor (or plurality of temperature sensors) that store data in the resident storage devices for later transmission and (2) a pressure sensor (or plurality of pressure sensors) that transmit data to an external device in real-time or near real-time. In this way, such an autonomous monitoring device 10, may provide certain critical information regarding a first operating parameter (for example, pressure) immediately (i.e., in real-time) while a second operating parameter (for example, temperature) is provided thereafter. Indeed, critical information regarding multiple parameters may be provided in real-time (or near real-time) while other parameters are provided after completion of the process under investigation.

In those embodiments where autonomous monitoring device 10 includes circuitry for real-time communication of, for example, data which is representative of the time sequence of the measured parameter, autonomous monitoring device 10 may facilitate real-time feedback—that is, real-time adjustment, tuning, and/or control of the process and/or fabrication equipment. For example, where autonomous monitoring device 10 is employed to measure film thickness during CMP, autonomous monitoring device 10 may provide feedback, in real time, of film thickness distribution across the surface of substrate 16 of autonomous monitoring device 10. These embodiments may allow the process and/or fabrication equipment to adjust the pressure for certain areas of the wafer, or stop processing when the polishing reaches or achieves a desired specification. Thus, autonomous monitoring device 10 may collect information during the process, the information may be analyzed, in real-time, and provided to the fabrication equipment, in real-time, for adjustment of process conditions to enhance and/or optimize the process results.

Notably, as mentioned above, the embodiments of the system, device, and components thereof (for example, the electrical source and communications layout, circuitry and techniques), as well as the methods, applications and/or techniques, that are described and illustrated in the '806 application, are incorporated by reference herein. Moreover, the sensor array may be KAI-1100M and/or KAI-11000CM from Kodak, Rochester, N.Y., USA. The implementation and operation of the KAI-1100M and/or KAI-11000CM are described, in detail, in the application notes, technical/journal articles and data sheets (for example, Performance Specification, Revision 3.0, Jun. 2, 2003, 42 pages) for the KAI-1100M and/or KAI-11000CM products, which are hereby incorporated by reference. For the sake of brevity, those discussions, descriptions and illustrations are not repeated herein.

Finally, it should be noted that the term "circuitry" or "electronics" may mean a circuit (whether integrated or otherwise), a group of such circuits, a processor(s), a processor(s) implementing software, or a combination of a circuit (whether integrated or otherwise), a group of such circuits, a processor(s) and/or a processor(s) implementing software. The term "circuit" may mean either a single component or a multiplicity of components, either active and/or passive, which are coupled together to provide or perform a desired function. The term "data" may mean a current or voltage signal(s), or a state of or in a memory cell(s), whether in an analog or a digital form. The phrases "to sample" or "sample(s)" or the like, may mean, among other things, to detect, to sense, to measure, to record, and/or to monitor.

What is claimed is:

1. A device comprising:
    a substrate having a wafer-like shape capable of being disposed within integrated circuit processing equipment, the substrate comprising:
        an event sensor, to generate an output representative of an event related to the integrated circuit processing equipment, and
        a process parameter sensor to sense a process parameter of a process performed by the integrated circuit processing equipment, wherein the process parameter sensor senses the process parameter in response to a control signal; and
    a controller, coupled to the event sensor and coupled to the process parameter sensor, to receive the output from the event sensor and to detect at least one predetermined event based on the output, wherein the controller generates the control signal in response to detecting the at least one predetermined event and provides the control signal to the process parameter sensor.

2. The device of claim 1 wherein the substrate is capable of being disposed on a wafer stage of the integrated circuit processing equipment.

3. The device of claim 2 wherein the event sensor is an accelerometer and the output is representative of the acceleration of the wafer stage of the integrated circuit processing equipment.

4. The device of claim 2 wherein the event sensor is a velocity, inertial or position sensor.

5. The device of claim 2 wherein the integrated circuit processing equipment is lithographic equipment and the process parameter sensor is an image sensor that samples the intensity of an aerial image of a photomask produced by the integrated circuit processing equipment.

6. The device of claim 5 wherein the event sensor is an accelerometer and the output is representative of the acceleration of the wafer stage of the integrated circuit processing equipment.

7. The device of claim 5 wherein the event sensor is a velocity, inertial or position sensor.

8. The device of claim 1 wherein the controller detects the at least one predetermined event by analyzing the output of the event sensor using a plurality of predetermined criteria.

9. The device of claim 1 further comprising:
communications circuitry, coupled to the controller, to provide data representative of the process parameter to external circuitry; and
at least one rechargeable battery to provide electrical power to the controller and the process parameter sensor.

10. A device comprising:
a substrate capable of being disposed on a wafer stage of integrated circuit processing equipment, the substrate comprising:
   a first event sensor to generate a first output representative of a first event related to the integrated circuit processing equipment,
   a second event sensor to generate a second output representative of a second event related to the integrated circuit processing equipment, wherein the first and second events are different types of events, and
   a process parameter sensor to sense a process parameter of a process performed by the integrated circuit processing equipment, wherein the process parameter sensor senses the process parameter in response to a control signal; and
a controller, coupled to the first and second event sensors and coupled to the process parameter sensor, to receive the second output from the second event sensor and to detect at least one predetermined event based on the second output, wherein the controller generates the control signal in response to detecting the at least one predetermined event and provides the control signal to the process parameter sensor.

11. The device of claim 10 wherein the first output is representative of whether the substrate is disposed on the wafer stage of the integrated circuit processing equipment.

12. The device of claim 11 wherein the second event sensor is a velocity, inertial, acceleration or position sensor.

13. The device of claim 12 wherein the process parameter sensor senses temperature, pressure, chemical concentration, fluid flow rate, illumination intensity, image projection, focus, photomask integrity, aerial image integrity or surface profile.

14. The device of claim 10 wherein the integrated circuit processing equipment is lithographic equipment and the process parameter sensor is an image sensor that samples the intensity of an aerial image of a photomask produced by the integrated circuit processing equipment.

15. The device of claim 14 wherein the second event sensor is an accelerometer and the second out put is representative of the acceleration of the wafer stage of the integrated circuit processing equipment.

16. The device of claim 14 wherein the second event sensor is a velocity, inertial or position sensor.

17. The device of claim 10 wherein the first output is representative of whether the substrate is disposed on the wafer stage of the integrated circuit processing equipment and wherein the controller, in response to the first output generates an enable signal and provides the enable signal to the process parameter sensor.

18. The device of claim 17 wherein the enable signal enables the process parameter sensor to sense the process parameter.

19. The device of claim 10 wherein the controller detects the at least one predetermined event by analyzing the second output using a plurality of predetermined criteria.

20. The device of claim 19 wherein the controller includes data storage to store the plurality of predetermined criteria.

21. The device of claim 10 further comprising:
communications circuitry, coupled to the controller, to provide data representative of the process parameter to external circuitry; and
at least one rechargeable battery to provide electrical power to the controller and the process parameter sensor.

22. A device comprising:
a substrate capable of being disposed on a wafer stage of integrated circuit processing equipment, the substrate comprising:
   an event sensor to generate an output representative of acceleration, velocity, inertia or motion of the substrate, and
   a process parameter sensor to sense a process parameter of a process performed by the integrated circuit processing equipment, wherein the process parameter sensor senses the process parameter in response to a data acquisition signal; and
a controller, coupled to the event sensor and the process parameter sensor, to receive the output from the event sensor and to detect at least one predetermined event based on the output, wherein the controller generates the data acquisition signal in response to detecting the predetermined event and provides the data acquisition signal to the process parameter sensor.

23. The device of claim 22 wherein the integrated circuit processing equipment is lithographic equipment and the process parameter sensor is an image sensor that samples the intensity of an aerial image of a photomask produced by the integrated circuit processing equipment.

24. The device of claim 22 wherein the controller detects the at least one predetermined event by analyzing the output of the event sensor using a plurality of predetermined criteria.

25. The device of claim 24 wherein the controller includes data storage to store the plurality of predetermined criteria.

26. The device of claim 22 further comprising:
communications circuitry, coupled to the controller, to provide data representative of the process parameter to external circuitry; and
at least one rechargeable battery, to provide electrical power to the controller and the process parameter sensor.

* * * * *